(12) United States Patent
Gaku et al.

(10) Patent No.: US 6,265,767 B1
(45) Date of Patent: Jul. 24, 2001

(54) SEMICONDUCTOR PLASTIC PACKAGE, METAL PLATE FOR SAID PACKAGE, AND METHOD OF PRODUCING COPPER-CLAD BOARD FOR SAID PACKAGE

(75) Inventors: Morio Gaku; Nobuyuki Ikeguchi; Toshihiko Kobayashi, all of Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 0 days.

(21) Appl. No.: 09/583,148

(22) Filed: May 30, 2000

Related U.S. Application Data

(62) Division of application No. 09/237,840, filed on Jan. 27, 1999, now Pat. No. 6,097,089.

(30) Foreign Application Priority Data

| Apr. 3, 1919 | (JP) | 10-91635 |
| Jan. 28, 1998 | (JP) | 10-15894 |
| Apr. 10, 1998 | (JP) | 10-99550 |
| May 12, 1998 | (JP) | 10-145208 |
| Jun. 2, 1998 | (JP) | 10-169271 |
| Jun. 2, 1998 | (JP) | 10-169272 |
| Aug. 20, 1998 | (JP) | 10-250445 |
| Nov. 9, 1998 | (JP) | 10-333453 |
| Dec. 14, 1998 | (JP) | 10-375342 |

(51) Int. Cl.[7] .................................................. H01L 21/44
(52) U.S. Cl. ........................... 257/678; 257/706; 257/712
(58) Field of Search ................................ 257/117, 706, 257/707, 712, 713, 722; 361/704, 710; 438/108

(56) References Cited

U.S. PATENT DOCUMENTS

| 5,397,917 | 3/1995 | Ommen et al. | 257/698 |
| 5,453,641 | 9/1995 | Mundinger et al. | 257/714 |
| 5,528,456 | * 6/1996 | Takahashi | 361/704 |
| 5,581,122 | 12/1996 | Chao et al. | 257/691 |
| 5,602,491 | 2/1997 | Vasquez et al. | 324/760 |
| 5,659,458 | 8/1997 | Patchen | 361/704 |
| 5,691,794 | * 11/1997 | Hoshi | 349/158 |
| 5,708,567 | 1/1998 | Shim et al. | 361/723 |
| 5,796,589 | 8/1998 | Barrow | 361/774 |
| 5,847,936 | 12/1998 | Forehand et al. | 257/738 |
| 5,866,953 | * 2/1999 | Akram | 257/790 |
| 5,891,753 | * 4/1999 | Akram | 438/108 |
| 5,923,084 | 7/1999 | Inoue et al. | 257/712 |
| 5,977,629 | * 11/1999 | Fogal | 257/712 |
| 5,998,875 | 12/1999 | Bodo et al. | 257/778 |
| 6,014,318 | 1/2000 | Takeda | 361/764 |
| 6,087,682 | * 7/2000 | Ando | 257/178 |
| 6,115,255 | * 9/2000 | Iovdalsky | 361/705 |

FOREIGN PATENT DOCUMENTS 62-290163 * 12/1987 (JP) .

* cited by examiner

Primary Examiner—Olik Chaudhuri
Assistant Examiner—Nathan W. Ha
(74) Attorney, Agent, or Firm—Wenderoth, Lind & Ponack, L.L.P.

(57) ABSTRACT

There is provided a semiconductor plastic package in the form in which at least one semiconductor chip is mounted on a small-sized printed wiring board, a metal plate for the above package and a method of producing a copper-clad board for the above package. More particularly, there is provided a semiconductor plastic package suitable for relatively high-watt, multi-terminal and high-density semiconductor plastic packages such as a microprocessor, a microcontroller, ASIC and graphic, and a method of producing the same.

7 Claims, 8 Drawing Sheets

SEMICONDUCTOR PLASTIC PACKAGE, METAL PLATE FOR SAID PACKAGE, AND METHOD OF PRODUCING COPPER-CLAD BOARD FOR SAID PACKAGE

This is a divisional of Ser. No. 09/237,840, filed Jan. 27, 1999, now U.S. Pat. No. 6,097,089.

BACKGROUND OF THE INVENTION

1. Field of the Invention

The present invention relates to a novel semiconductor plastic package in the form in which at least one semiconductor chip is mounted on a small-sized printed wiring board, a metal plate for the above package and a method of producing a copper-clad board for the above package. It relates particularly to a semiconductor plastic package suitable for relatively high-watt, multi-terminal and high-density semiconductor plastic packages such as a microprocessor, a micro-controller, ASIC and graphic, and a method of producing the same. The semiconductor plastic package of the present invention is used for an electronic device by mounting it on a mother board wiring board with solder balls.

2. Description of Prior Art

There are conventionally known semiconductor plastic packages such as a plastic ball grid array (P-BGA) and a plastic land grid array (P-LGA), which are structured by fixing a semiconductor chip on the upper surface of a plastic printed circuit board, bonding the semiconductor chip to a conductor circuit formed on the upper surface of the printed circuit board by wire-bonding, forming a conductor pad for connection to a mother board printed circuit board on the lower surface of the printed circuit board with a solder ball, connecting front and reverse circuit conductors with a plated through-hole and encapsulating the semiconductor chip with a resin. In the above known structure, a plated heat-diffusible through-hole to connect a semiconductor-chip-fixing metal foil on the upper surface to the lower surface is formed for diffusing heat generated in the semiconductor chip to the mother board printed circuit board.

There is a risk that moisture may be absorbed through the above through hole into a silver-powder-containing resin adhesive used for fixing a semiconductor and may cause an interlayer swelling due to heating at a time of mounting the above package on the mother board or heating when a semiconductor part is removed from the mother board, and it is called a "popcorn phenomenon". When the popcorn phenomenon takes place, the package is no longer usable in most cases, and it is required to overcome the above phenomenon to a great extent.

Further, attaining of higher functions of a semiconductor and increasing a density thereof imply an increase in the amount of heat to be generated, and the formation of only a through-hole immediately below the semiconductor chip for diffusing heat is not sufficient any more.

SUMMARY OF THE INVENTION

It is an object of the present invention to provide a semiconductor plastic package having excellent heat diffusibility and heat resistance after moisture absorption, and a method of producing the same.

It is another object of the present invention to provide a semiconductor plastic package having a novel structure which is suitable for mass-production and is improved in economic performances, and a method of producing the same.

According to the present invention, there is provided a semiconductor plastic package having a structure in which a metal sheet having a size nearly equal to the size of a printed wiring board is disposed nearly in the middle of the thickness direction of the printed wiring board, at least one semiconductor chip is fixed on one surface of the printed wiring board with a thermally conductive adhesive, the metal sheet is insulated from circuits on the front and reverse surfaces of the printed wiring board with a thermosetting resin composition, a circuit conductor formed on the surface of the printed wiring board and the semiconductor chip are connected with each other by wire bonding, a signal propagation circuit conductor on the surface of the printed wiring board and a circuit conductor formed on the reverse surface of the printed wiring board or a circuit conductor pad formed for connection to an external portion of said package with solder balls are at least connected with a through hole conductor insulated from the metal sheet with a resin composition, at least one through hole forms a direct junction with the metal sheet disposed as an inner layer, and at least the semiconductor chip, the bonding wire and the bonding pad are encapsulated, wherein a plurality of protrusions having the form of a cone or a frustum of a cone each are formed on that portion of at least one surface of the metal sheet which is within an area where the semiconductor chip is mounted, and tops of said metal protrusions are in contact with the thermally conductive adhesive or a metal foil.

Further, according to the present invention, there is provided a semiconductor plastic package as recited above, wherein a plurality of the metal protrusions having the form of a cone each are formed on a portion where the semiconductor chip is directly mounted and the tops of said metal protrusions are in contact with the thermally conductive adhesive, a solder or a metal foil on which the semiconductor chip is mounted.

Further, according to the present invention, there is provided a semiconductor plastic package as recited above, wherein a plurality of the metal protrusions having the form of a frustum of a cone each are formed on a metal portion where the semiconductor chip is directly mounted and the tops of said metal protrusions are in contact with the thermally conductive adhesive, a solder or a metal foil on which the semiconductor chip is mounted.

Further, according to the present invention, there is provided a semiconductor plastic package as recited above, wherein a plurality of the metal protrusions having the form of a frustum of a cone each are exposed from part of the metal portion where the semiconductor chip is directly mounted, or the metal protrusions are coated with a metal plating, and the semiconductor chip is fixed on the metal protrusions having the form of a cone or a frustum of a cone and the metal foil.

Further, according to the present invention, there is provided a semiconductor plastic package as recited above, wherein a plurality of the metal protrusions having the form of a cone or a frustum of a cone are in direct contact with a metal foil to which the semiconductor chip are directly fixed, or a plurality of the metal protrusions are in contact with the metal foil through a thermally conductive adhesive, a plane which is opposite to, and corresponds nearly to, a plane to which the semiconductor chip is fixed is provided with a plurality of metal protrusions having the form of a cone or a frustum of a cone and said metal protrusions are in contact with a metal foil.

Further, according to the present invention, there is provided a semiconductor plastic package as recited above, wherein a plurality of the metal protrusions having the form of a cone or a frustum of a cone are in contact with the metal foil through a thermally conductive adhesive.

Further, according to the present invention, there is provided a semiconductor plastic package as recited above, wherein tops of a plurality of the metal protrusions are exposed independently of a front-surface metal foil to which the semiconductor chip is directly fixed and a reverse-surface metal foil to which solder ball pads are fixed, the exposed top portions of the metal protrusions are desmeared, the through hole for conduction between circuits on the front and reverse surfaces, the through hole is entirely plated with a metal, circuits are formed on the front and reverse surfaces, and at least a semiconductor-chip-mounting portion, a bonding pad portion and a solder ball pad portion are plated with noble metal.

Further, according to the present invention, there is provided a semiconductor plastic package as recited above, which may have a double-side metal-foil-clad laminate prepared by forming an elevated flat portion on one surface of the metal sheet constituting part of the printed wiring board on the semiconductor-chip-mounting side, forming the metal protrusions having the form of a cone or a frustum of a cone on the other surface opposite to the above surface, making a clearance hole or a slit for the through hole in a portion different from the elevated flat portion, disposing a prepreg, a resin sheet or an applied resin sheet having a hole a little greater than said elevated flat portion on the surface where the elevated flat portion is formed, disposing a metal foil, a single-side copper-clad laminate or a chemically treated double-side copper-clad laminate or multi-layered sheet having a circuit on one side with the circuit side facing toward the resin layer if no metal foil is attached to the outer surface of the protrusions having the form of a frustum of cone, placing a metal foil on the other surface, and laminate-forming the resultant set under heat and pressure.

Further, according to the present invention, there is provided a method of producing a metal sheet for a metal-sheet-inserted double-side metal-foil-clad laminate for a semiconductor plastic package, the metal-sheet-inserted double-side metal-foil-clad laminate being a printed wiring board to which at least one semiconductor chip is to be fixed and being obtained by placing prepregs of a thermosetting resin composition in a semi-cured state, resin sheets of said thermosetting resin composition, metal foils with said thermosetting resin composition or a layer of said thermosetting resin composition on front and reverse surfaces of a metal sheet having a plurality of metal protrusions having the form of a frustum of a cone and a clearance hole or a slit hole in which a through hole for conduction between the front and reverse surfaces, placing metal foil or foils thereon and laminate-forming the resultant set under heat and pressure, the method comprising placing a solder for forming the protrusions having the form of a frustum of a cone on part of one surface of a metal sheet as a raw material, placing an etching resist for forming the clearance hole or the slit hole by etching on the other surface of the metal sheet, and simultaneously forming the protrusions having the form of a frustum of a cone and the clearance hole or the slit hole in an etching step of blowing an alkaline etching liquid having a lower pressure to a surface where the protrusions having the form of a frustum of a cone are to be formed and blowing an alkaline etching liquid having a higher pressure to the other surface, to form a printed wiring board having a specially shaped metal sheet inserted therein.

Further, according to the present invention, there is provided a method as recited above, wherein the metal sheet as a raw material is etched partially in the thickness direction thereof, then, solders are bonded to the surface where the protrusions having the form of a cone or a frustum of a cone are to be formed and that portion of the reverse surface which corresponds to the above surface, and an alkaline etching solution is blown to both the surfaces at an equal pressure to form solder-bonded protrusions having the form of a cone or a frustum of a cone and the clearance hole or the slit hole at the same time to form the metal sheet for a printed wiring board having a specially shaped metal sheet inserted.

Further, according to the present invention, there is provided a method of producing a copper-clad sheet for a printed wiring board for a semiconductor plastic package having a structure in which a metal sheet having a size nearly equal to the size of a printed wiring board is disposed nearly in the middle of the thickness direction of the printed wiring board, at least one semiconductor chip is fixed on one surface of the printed wiring board with a thermally conductive adhesive, the metal sheet is insulated from circuits on the front and reverse surfaces of the printed wiring board with a thermosetting resin composition, a circuit conductor formed on the surface of the printed wiring board and the semiconductor chip are connected with each other by wire bonding, a signal propagation circuit conductor on the surface of the printed wiring board and a circuit conductor formed on the reverse surface of the printed wiring board or a circuit conductor pad formed for connection to an external portion of said package with solder balls are at least connected with a through hole conductor insulated from the metal sheet with a resin composition, at least one through hole forms a direct junction with the metal sheet disposed as an inner layer, and at least the semiconductor chip, the bonding wire and the bonding pad are encapsulated, the method comprising placing prepregs or resin sheets on positions of a plurality of metal protrusions which have the form of a cone or a frustum of a cone each and are formed on parts of both surfaces of the metal sheet, the prepregs or resin sheets having holes made slightly greater than the area of the position, placing metal foils thereon, and applying heat and pressure to fill the resin in a clearance hole made in the metal sheet and flow the resin into spaces among a plurality of the metal protrusions, an outermost metal foil being in contact with tops of the metal protrusions.

DETAILED DESCRIPTION OF THE INVENTION

Figure 1:
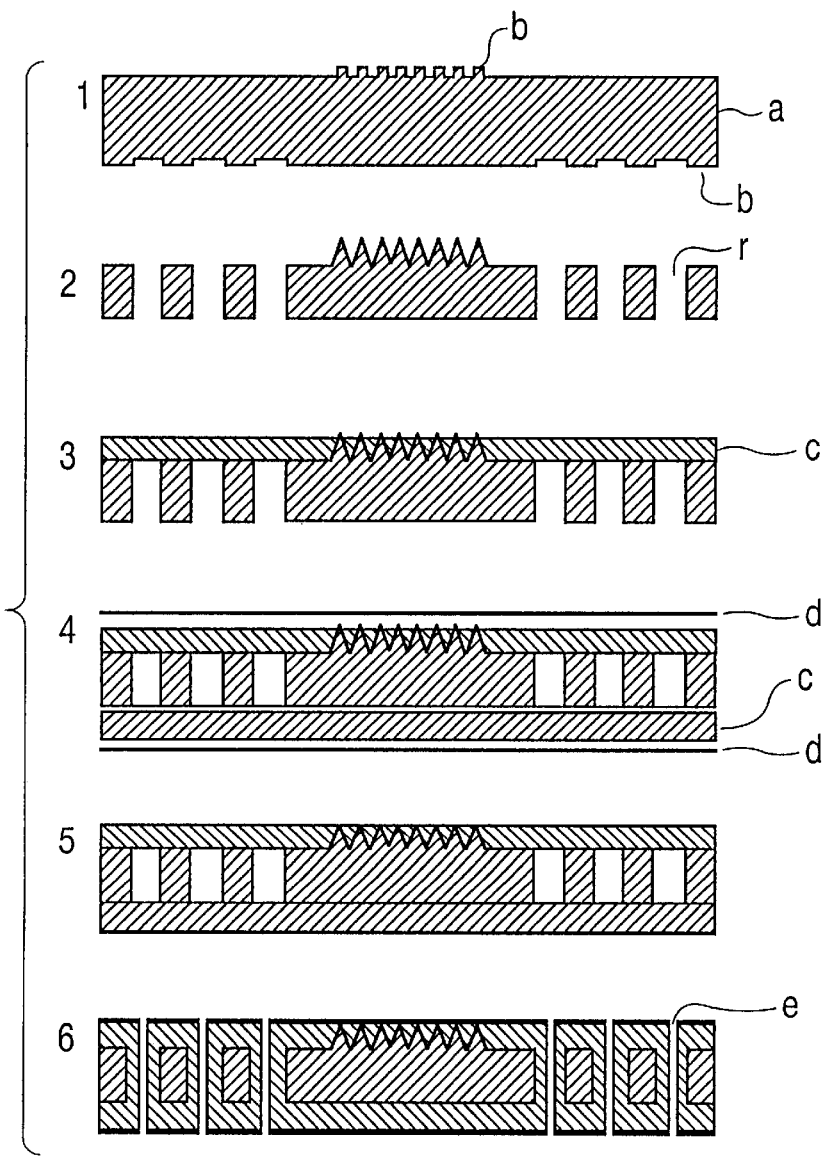
FIG. 1 schematically shows the steps of producing a semiconductor plastic package in which a plurality of metal protrusions having the form of a cone are in contact with a metal foil on which a semiconductor chip is mounted or the metal protrusions are in direct contact with a thermally conductive adhesive.

That is, in a semiconductor plastic package having a structure in which a metal sheet having a size nearly equal to the size of a printed wiring board is disposed nearly in the middle of the thickness direction of the printed wiring board, at least one semiconductor chip is fixed on one surface of the printed wiring board with a thermally conductive adhesive, the metal sheet is insulated from circuits on the front and reverse surfaces of the printed wiring board with a thermosetting resin composition, a circuit conductor formed on the surface of the printed wiring board and the semiconductor chip are connected with each other by wire bonding, a signal propagation circuit conductor on the surface of the printed wiring board and a circuit conductor formed on the reverse surface of the printed wiring board or a circuit conductor pad formed for connection to an external portion of said package with solder balls are at least connected with a through hole conductor insulated from the metal sheet with a resin composition, at least one through hole forms a direct junction with the metal sheet disposed as an inner layer, and at least the semiconductor chip, the bonding wire and the bonding pad are encapsulated, the present invention has characteristic features in that plurality of protrusions having the form of a cone or a frustum of a cone each are formed on that portion of at least one surface of the metal sheet which is within an area where the semiconductor chip is mounted, and that tops of said metal protrusions are in contact with the thermally conductive adhesive or a metal foil.

When the semiconductor plastic package is formed in a structure in which a plurality of metal protrusions having the form of a cone or a frustum of a cone are formed in a portion where a semiconductor chip is to be directly fixed and tops of the metal protrusions are in contact with a thermally conductive adhesive or a metal foil on a surface where the semiconductor chip is to be mounted, no absorption of moisture from a surface below the semiconductor chip takes place, a great improvement is attained in the heat resistance after the moisture absorption or the popcorn phenomenon can be remarkably overcome, and the semiconductor plastic package is excellent in the properties of electric insulation and anti-migration after a pressure cooker test and is improved in heat diffusibility. Further, the above semiconductor plastic package having the above novel structure is feasible for-mass-production and is thus improved in economic performances.

In the plastic package of the present invention, a metal sheet having excellent heat diffusibility is disposed nearly in the middle of the thickness direction of a printed wiring board, a plated through hole for connecting circuits on the front and reverse surfaces has a diameter smaller than the diameter of a clearance hole made in the metal sheet, and the plated through hole is made nearly in the center of a resin filled in the clearance hole, whereby the insulation of the through hole from the metal sheet can be maintained.

In a method in which a semiconductor chip is fixed on the upper surface of a known metal sheet printed wiring board having a through hole, like a conventional P-BGA package, heat generated from the semiconductor chip is inevitably directed to a heat-diffusible through hole immediately below the semiconductor chip to be diffused, and the popcorn phenomenon cannot be overcome.

In the present invention, first, a plurality of protrusions having the form of a cone or a frustum of a cone are formed on a metal in a position where a semiconductor chip is to be fixed, by a known etching method or the like. At the same time or thereafter, a clearance hole having a diameter greater than the diameter of a through hole is made in a position where the through hole is to be made in the metal sheet, by a known etching method, punching method, drilling method or laser-applied method.

The metal sheet in or on which the above protrusions having the form of a cone or a frustum of a cone and the through hole are formed is surface-treated according to a known method, such as a method of oxidation treatment, formation of fine concave and convex portions or formation of a coating, as required for improving it in adhesion and electric insulation properties. On the entire surface of the above metal sheet which is surface-treated and has a plurality of protrusions having the form of a cone or a frustum of a cone, an entire-surface insulating portion of a thermosetting resin composition is formed such that the protrusions having the form of a cone or a frustum of a cone are slightly exposed. The insulating portion of a thermosetting resin composition is formed of a prepreg, a resin sheet or a metal foil with a resin, prepared by impregnating a base material with the thermosetting resin composition and drying it.

The insulation portion is formed so as to have such a height that the metal protrusions having the form of a cone or a frustum of a cone or said protrusions to which the thermally conductive adhesive or a solder adheres contact the metal foil on the front surface to which the semiconductor chip is to be fixed. Heat generated from the semiconductor chip thermally conducted from the semiconductor-chip-mounted portion through the protrusions having the form of a cone or a frustum of a cone in the inner layer metal sheet to the metal sheet, and it is diffused through solder ball pads which forms a junction with the metal sheet to a mother board printed wiring board to which the printed wiring board is bonded with solder balls. On the reverse surface, a prepreg, a resin sheet, a metal foil with a resin or an applied resin layer having a resin amount and a resin flow sufficient for fully filling the resin in the clearance hole is disposed, a metal foil is arranged if no metal foil is attached, and these components were laminate-formed under heat and pressure preferably under vacuum, to integrate them. Symbols in drawings attached to the present specification have the following meanings. a: metal sheet, b: etching resist, c: resin layer or prepreg, d: metal foil, e: through hole for conduction between front and reverse circuits, f:

semiconductor chip, g: thermally conductive adhesive, h: bonding wire, i: solder balls, j: encapsulation resin, k: plating resist, l: metal-plated through hole for the conduction between the front and reverse circuits, m: metal protrusions having the form of a frustum of a cone, n: metal of plating on metal protrusions having the form of a frustum of a cone, o: noble metal plating, p: electric circuit, q: lead-free solder, r: clearance hole, s: plating on a metal foil and a through hole portion, t: double-side copper-clad laminate, u: elevated flat portion, β: through hole for heat diffusion.

Figure 2:
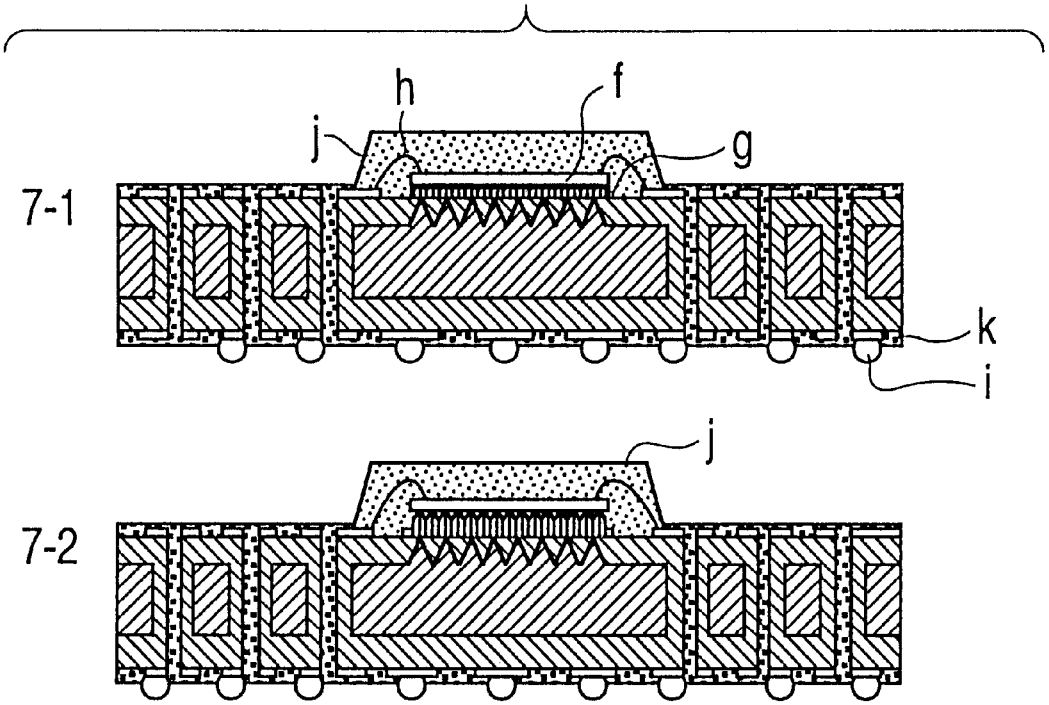
FIG. 2 schematically shows the steps of producing a semiconductor plastic package in which a plurality of metal protrusions having the form of a cone are in contact with a metal foil on which a semiconductor chip is mounted or the metal protrusions are in direct contact with a thermally conductive adhesive.

The semiconductor plastic package of the present invention may be a variant in which a plurality of the metal protrusions having the form of a cone are formed in a portion where a semiconductor chip is directly fixed, tops of the above metal protrusions are partially exposed on the surface and a semiconductor chip is bonded thereon with the thermally conductive adhesive, or the tops of the metal protrusions are brought into contact with and connected to a metal foil and the semiconductor chip is bonded thereto with a thermally conductive adhesive (see FIGS. 1 and 2).

Figure 3:
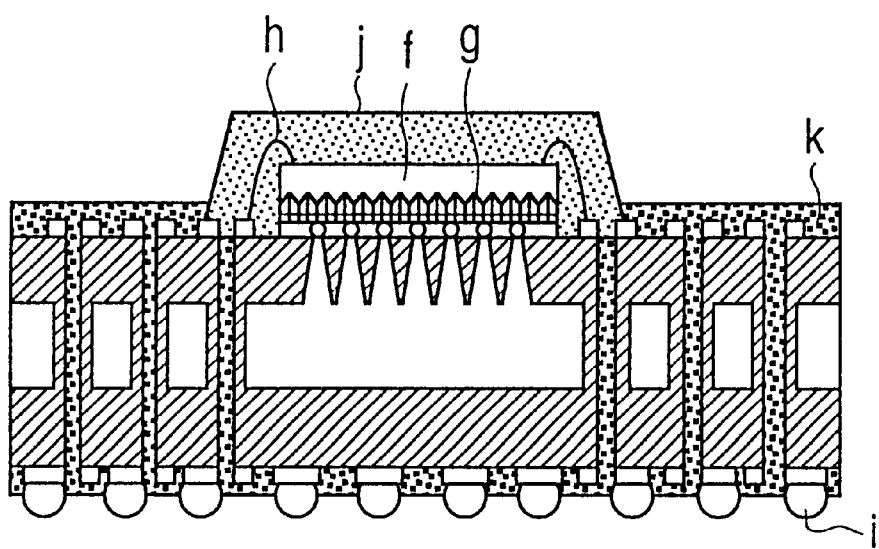
FIG. 3 schematically shows a semiconductor plastic package in which metal protrusions having the form of a frustum of a cone are in contact with a semiconductor-chip-mounting metal foil through a solder paste.

The semiconductor plastic package of the present invention may be a variant in which a plurality of the metal protrusions having the form of a frustum of a cone are formed in a portion where a semiconductor chip is directly fixed, and tops of the above metal protrusions are in contact with the metal foil on which the semiconductor chip is mounted, through the thermally conductive adhesive or a solder (see FIG. 3).

Figure 4:
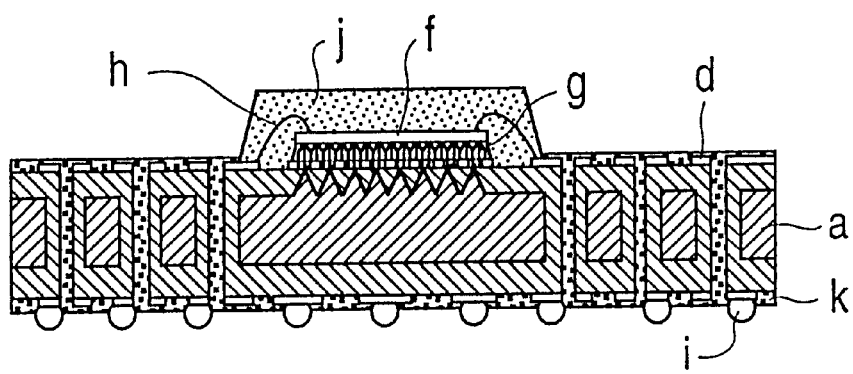
FIG. 4 schematically shows a semiconductor plastic package in which a semiconductor chip is fixed to the metal protrusions having the form of a frustum of a cone and a metal foil with a thermally conductive adhesive.

The semiconductor plastic package of the present invention may be another variant having a structure in which a plurality of the metal protrusions having the form of a cone or a frustum of a cone are exposed in part of the metal foil where a semiconductor chip is to be directly mounted, independently of the metal foil, or the top portions thereof are covered with a metal plating and the semiconductor chip is fixed on the metal protrusions having the form of a cone or a frustum of a cone and the metal foil with a thermally conductive adhesive (See FIG. 4).

Figure 5:
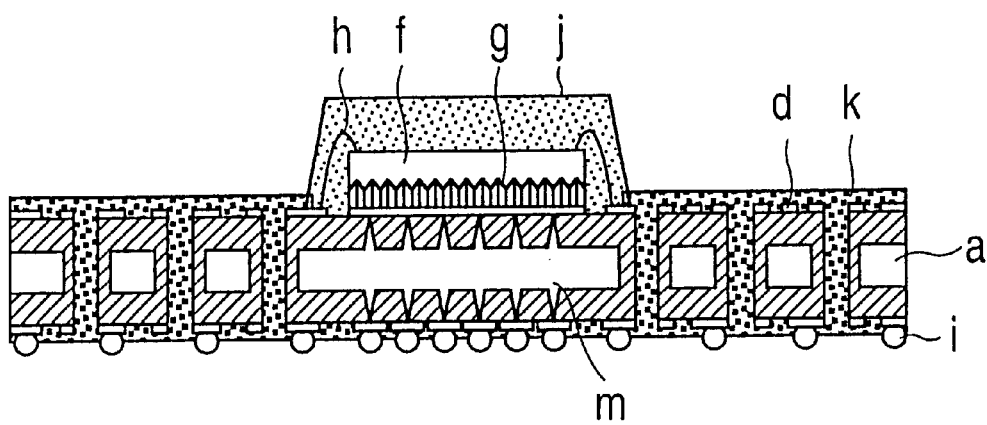
FIG. 5 schematically shows a semiconductor plastic package having metal protrusions having the form of a frustum of a cone on a side where a semiconductor chip is to be mounted and on a plane opposite thereto.

The semiconductor plastic package of the present invention may be another variant having a structure in which a plurality of the metal protrusions having the form of a cone or a frustum of a cone are formed on the metal sheet constituting part of the printed wiring board such that the metal protrusions are in direct contact with a metal foil to which a semiconductor chip is directly fixed or that the metal protrusions are in contact with the metal foil through a thermally conductive adhesive, the semiconductor chip is fixed onto the metal foil surface which is to constitute a semiconductor-chip-mounting portion and with which the protrusions are in contact, with a thermally conductive adhesive, and a plurality of metal protrusions having the form of a cone or a frustum of a cone are also formed on the reverse surface opposite to the semiconductor-chip-fixed plane such that the metal protrusions are in direct contact with a metal foil on the reverse surface or that the metal protrusions form a junction with the metal foil through the thermally conductive adhesive (see FIG. 5).

Figure 6:
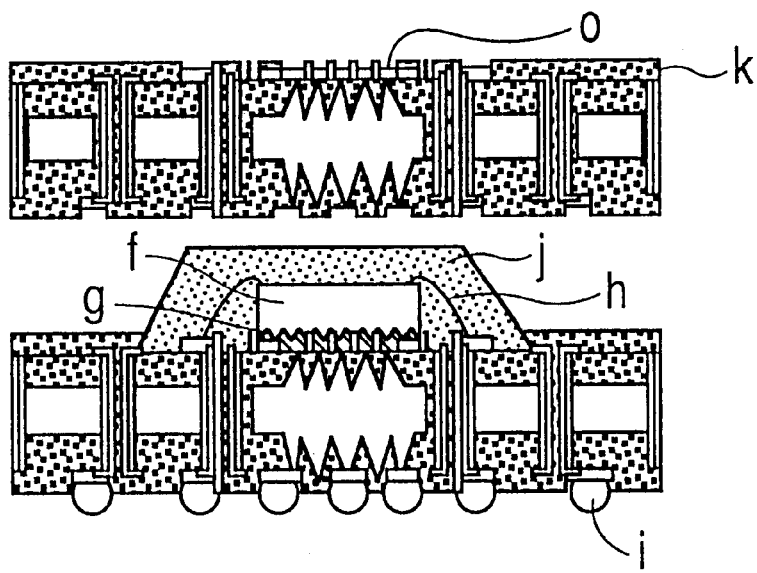
FIG. 6 schematically shows a semiconductor plastic package in which metal protrusions having the form of a frustum of a cone are exposed independently of a metal foil on the side where a semiconductor chip is mounted and a metal foil on a surface opposite thereto.

The semiconductor plastic package of the present invention may be another variant having a structure in which a plurality of the metal protrusions having the form of a cone or a frustum of a cone are formed on the metal sheet constituting part of the printed wiring board, tops of the metal protrusions are exposed independently of the front-surface metal foil to which the semiconductor chip is fixed and the reverse-surface metal foil to which solder ball pads for heat diffusion are fixed, the exposed top portions of the metal protrusions are desmeared, the through hole for conduction between circuits on the front and reverse surfaces is made so as not to be in contact with the metal sheet, the through hole is entirely plated with a metal, circuits are formed on the front and reverse surfaces, then, at least the semiconductor-chip-mounting portion, the bonding pad portion and the solder ball pad portion are plated with noble metal, and the semiconductor chip is fixed to the semiconductor-chip-mounting portion on the front surface with a thermally conductive adhesive (see FIG. 6).

Further, the semiconductor plastic package of the present invention may be another variant using a double-side metal-foil-clad laminate prepared by forming an elevate flat portion on one surface of the metal sheet constituting part of the printed wiring board on the semiconductor-chip-mounting side, forming the metal protrusions having the form of a cone or a frustum of a cone on the other surface opposite to the above surface, making a clearance hole or a slit for the through hole in a portion different from the elevated flat portion, disposing a prepreg, a resin sheet or an applied resin sheet having holes a little greater than said elevated flat portion on the surface where the elevated flat portion is formed, disposing a metal foil, a single-side copper-clad laminate or a chemically treated double-side copper-clad laminate or multi-layered sheet having a circuit on one side with the circuit side facing toward the resin layer if no metal foil is attached to the outer surface of the protrusions having the form of a frustum of cone, placing a metal foil on the other surface, and laminate-forming the resultant set under heat and pressure. In this case, preferably, a resin which flows out on the top portions of the elevated flat portion are removed by a sand blasting method to such an extent that the semiconductor-chip-mounting area of the metal surface is exposed (see FIG. 7).

The side surface of the metal sheet may have any form in which, e.g., a thermosetting resin composition is filled or it is exposed.

For forming a through hole printed wiring board by a subtractive method, a metal-foil-clad laminate of which the front and reverse surfaces are coated with metal foils and which has the metal sheet inside is formed by placing metal foils a little greater than the printed wiring board on front and reverse outermost layers and laminate-forming the resultant set under heat and pressure in a laminate-forming step.

When laminate-formation is carried out without using any metal foils on the front-surface and reverse-surface layers, a printed wiring board is produced by forming circuits according to a known additive method.

In the board prepared by the above subtractive method or semi-additive method, a small hole for the through hole for the conduction between circuits on the front and reverse surfaces is made in a portion different from the portion where a semiconductor chip is to be fixed, by a known method using a drill, a laser or plasma.

A hole for the through hole for signal circuits on the front and reverse surfaces is made nearly in the center of the clearance hole filled with a resin in the metal sheet such that the hole is not in contact with the metal sheet. The hole is desmeared as required, and then, the metal layer is formed on the inner surface of the through hole by electroless plating or electrolytic plating, to form a plated through hole. In a full additive method, further, terminals for wire-bonding, signal circuits, pads for solder balls, conductor circuits, etc., are formed on the front and reverse surfaces.

In the semi-additive method, the through hole is plated, and at the same time, the front and reverse surfaces are entirely plated. Then, circuits are formed on the front and reverse surfaces according to a known method.

After the front-surface and reverse-surface circuits are formed, a plating layer of a noble metal is formed on at least the wire-bonding pad surface, to complete the printed wiring board. In this case, portions requiring no plating with a noble metal are covered with a plating resist in advance. Otherwise, after the above plating, a coating of a known thermosetting resin composition or a photo-selective thermosetting resin composition is formed on at least surfaces other than the metal protrusions having the form of a cone, the bonding pads and the pad for bonding solder balls on the reverse surface.

A semiconductor chip is bonded to the above printed wiring board, i.e., a semiconductor chip is fixed to the surface of a portion where a plurality of the metal protrusions having the form of a cone or a frustum of a cone are partially exposed or a portion where a plurality of the metal protrusions having the form of a cone or a frustum of a cone are in contact with the front-surface metal foil, with a thermally conductive adhesive. Further, the semiconductor chip and the bonding pads of the printed wiring board circuits are connected to each other by a wire bonding method, and at least the semiconductor chip, the bonding wires and the bonding pads are encapsulated with a known encapsulation resin.

Solder balls are connected to conductor pads for connection to the solder balls on the surface opposite to the surface where the semiconductor chip is located, to prepare P-BGA, the solder balls are placed on a circuits on a mother board printed wiring board, and the balls are thermally melted for connection. Otherwise, P-LGA is prepared without attaching the solder balls to the package, and when the package is mounted on a mother board printed wiring board, the solder-ball-connecting conductor pads formed on the surface of the mother board printed wiring board and the conductor pads for solder balls for P-LGA are connected by melting the solder balls under heat.

Although not specially limited, the metal sheet for use in the present invention is preferably selected from those having a high elastic modulus and a high heat conductivity and having a thickness of 30 to 300 μm. Specifically, it is preferred to use pure copper, oxygen-free copper, an alloy of at least 95% by weight of copper with Fe, Sn, P, Cr, Zr, Zn or the like, or a metal sheet prepared by plating an alloy with copper.

In the present invention, although not specially limited, the height of the metal protrusions having the form of a cone or a frustum of a cone is preferably 50 to 150 μm. Further, the thickness of the insulating layer such as the prepreg, the resin sheet, the metal foil with a resin or the applied resin is smaller than the height of the metal protrusions to some extent, preferably smaller by 5 to 15 μm, and the insulating layer has a thickness to such an extent that the insulating layer comes into contact with a front-surface metal foil after the laminate-formation, or a thickness smaller than the thickness of the thermally conductive adhesive to be used for bonding the semiconductor chip. The metal protrusions having the form of a cone or a frustum of a cone cover an area equal to, or smaller than, the area of the semiconductor chip, or generally have an area of which sides are 5 to 20 mm long, and the metal protrusions are formed so as to exist below a portion where the semiconductor chip is to be fixed. Each of the metal protrusions having the form of a cone or a frustum of a cone has a bottom portion having a diameter of 0.1 to 5 μm and a top portion having a diameter of 0 to 1 μm. Further, as the metal protrusions having the form of a frustum of a cone, there may be used a structure formed by applying a metal-powder-containing adhesive onto a flat metal sheet such that the adhesive has the form of a frustum of a cone. The thermally conductive adhesive is selected from known adhesives. Specifically, the adhesive includes as a silver paste, a copper paste, a solder paste and a generally known lead-free solder containing tin, silver or copper.

In the present invention, the resin for the thermosetting resin composition is generally selected from known thermosetting resins. Specifically, the above resin includes an epoxy resin, a polyfunctional cyanate ester resin, a polyfunctional maleimide-cyanate ester resin, a polyfunctional maleimide resin and an unsaturated-group-containing polyphenylene ether resin. The above resins may be used alone or in combination. A polyfunctional cyanate ester resin composition is preferred in view of heat resistance, humidity resistance, anti-migration properties and electrical characteristics after moisture absorption.

The polyfunctional cyanate ester compound which is a preferred thermosetting resin component in the present invention refers to a compound whose molecule contains at least two cyanato groups.

Specific examples of the above polyfunctional cyanate ester compound includes 1,3- or 1,4-dicyanatobenzene, 1,3,5-tricyanatobenzene, 1,3-, 1,4-, 1,6-, 1,8-, 2,6- or 2,7-cyanatonaphthalene, 1,3,6-tricyanatonaphthalene, 4,4-dicyanatobiphenyl, bis(4-dicyanatophenyl)methane, 2,2-bis(4-cyanatophenyl)propane, 2,2-bis(3,5-dibromo-4-cyanotophenyl)propane, bis(4-cyanatophenyl)ether, bis(4-cyanatophenyl)thioether, bis(4-cyanatophenyl)sulfone, tris(4-cyanatophenyl)phosphite, tris(4-cyanatophenyl)phosphate, and cyanates obtained by a reaction between novolak and cyan halide.

Further, the above resin can be also selected from polyfunctional cyanate ester compounds disclosed in Japanese Patent Publications Nos. 41-1928, 43-18468, 44-4791, 45-11712, 46-41112, 47-26853 and 51-63149. There may be also used a prepolymer having a triazine ring formed by trimerizing cyanato groups of the above polyfunctional cyanate ester compounds and having a molecular weight of 400 to 600. The above prepolymer can be obtained by polymerizing the above polyfunctional cyanate ester in the presence of a catalyst selected from acids such as mineral acids and Lewis acids; bases such as sodium alcoholate and tertiary amines, or salts such as sodium carbonate. The above prepolymer contains partially unreacted monomer and is in the form of a mixture of monomer with prepolymer, and this material can be suitably used in the present invention. Generally, the resin is used in the form of a solution of it in an organic solvent in which the resin is soluble.

The epoxy resin can be generally selected from known epoxy resins. Specific examples of the epoxy resin include a liquid or solid bisphenol A type epoxy resin, a bisphenol F type epoxy resin, a phenol novolak type epoxy resin, a cresol novolak type epoxy resin, an alicyclic epoxy resin; polyepoxy compounds prepared by epoxidizing the double bond of butadiene, pentadiene, vinylcyclohexene and dicyclopentyl ether; and polyglycidyl compounds obtained by a reaction of a polyol, hydroxyl-group-containing silicone resins and epohalohydrin. The above resins may be used alone or in combination.

The polyimide resin can be generally selected from known polyimide resins. Specific examples of the polyimdie resin include reaction products of polyfunctional maleimides and polyamines, and polyimides having terminals having triple bonds, disclosed in JAP-B-57-005406.

The above thermosetting resins may be used alone, while it is preferred to combine them as required in view of a balance in properties.

The thermosetting resin composition used in the present invention may contain various additives as required so long as the inherent properties of the composition are not impaired. Examples of the above additives include monomers having a polymerizable double bond and prepolymers thereof; liquid rubbers having a low molecular weight and elastic rubbers having a high molecular weight such as polybutadiene, epoxidized butadiene, maleate butadiene, a butadiene-acrylonitrile copolymer, polychloroprene, a butadiene-styrene copolymer, polystyrene, butyl rubber, fluorine rubber and natural rubber; polyethylene, polypropylene, polybutene, poly-4-methylpentene, polystyrene, an AS resin, an TABS resin, an MOBS resin, styrene-isoprene rubber, a polyethylene-propylene copolymer and ethylene tetrafluoride-ethylene hexafluoride copolymer; prepolymers or oligomers having a high molecular weight such as polycarbonate, polyphenylene ether, polysulfone, polyester, polyphenylene sulfide; and polyurethane. The above additives are used as required. Further, the thermosetting resin composition used in the present invention may also contain various additives such as a known inorganic or organic filler, a dye, a pigment, a thickener, a lubricant, an anti-foamier, a dispersing agent, a leveling agent, a photosensitizer, a flame retardant, a brightener, a polymerization inhibitor and a thixotropic agent. These additives may be used alone or in combination as required. A curing agent or a catalyst is incorporated into a compound having a reactive group, as required.

The thermosetting resin composition used in the present invention is cured itself under heat. Since, however, its curing rate is low, it is poor in workability, economic performances, etc., and a known heat-curing catalyst is incorporated into the thermosetting resin. The amount of the catalyst per 100 parts by weight of the thermosetting resin is 0.005 to 10 parts by weight, preferably 0.01 to 5 parts by weight.

A known inorganic or organic woven fabric or non-woven fabric is generally used as a reinforcing substrate for the prepreg.

Specific examples of the reinforcing substrate include known glass fiber cloths such as E glass, S glass and D glass, a wholly aromatic polyamide fiber cloth, and a liquid crystal polyester fiber cloth. These may be mixtures. Further, there may be used a substrate prepared by applying the thermosetting resin to front and reverse surfaces of a film such as a polyimide film and bringing it into a semi-cured state by heating.

The metal foil used as outermost layers can be generally selected from known metal foils. Preferably, there is used a copper foil or a nickel foil, each of which has a thickness of 5 to 35 $\mu$m.

The clearance hole is made in the metal sheet so as to have a size slightly larger than the diameter of the through-hole for the conduction of the front and reverse surfaces. Specifically, the through-hole wall is preferably insulated with the thermosetting resin composition such that the distance between the through-hole wall and the wall of the metal sheet clearance hole is at least 50 $\mu$m. Although not specially limited, the through-hole for the front and reverse surface conduction preferably has a diameter of 50 to 300 mm.

When the prepreg for the printed wiring board of the present invention is prepared, the substrate is impregnated with the thermosetting resin composition, and the thermosetting resin composition is dried to obtain a laminating material in a semi-cured state. Further, a substrate-free resin sheet prepared in a semi-cured state may be used. Otherwise, a coating composition may be used.

In this case, a coating composition is converted to a high-flow, low flow or no-flow material depending upon the degree of a semi-cured state. When it is converted to a no-flow material, the flow distance of the resin after the laminate-formation under heat and pressure is 100 $\mu$m or less, preferably 50 $\mu$m or less. In this case, essentially, it bonds to the metal sheet or a metal foil without causing any voids. The temperature at which the prepreg is prepared is generally 100 to 180° C., the time therefore is 5 to 60 minutes, and the temperature and the time are properly selected depending upon the intended degree of the flow.

The method of producing the semiconductor plastic package having the metal sheet inserted, provided by the present invention, is not specially limited, while the method will be explained with reference to a case where the protrusions having the form of a cone are provided on a semiconductor-chip-mounting side hereinafter (FIGS. 1 and 2).

(1) The entire surface of a metal sheet (a) to be used as an inner layer is coated with a liquid etching resist (b), the metal sheet is heated to remove a solvent, then, a negative film which is prepared so as to retain a semiconductor-chip-fixing portion in a small circular form is covered thereon, the etching resist is exposed to ultraviolet light, the etching resist in portions other than an exposed portion in a circular form and in a clearance hole portion on the reverse surface is dissolved and removed with a 1% sodium carbonate aqueous solution.

(2) The metal sheet is dissolved to a predetermined thickness by etching, to form front-surface protrusions having the form of a cone and a clearance hole, the etching resist is removed, and the entire metal sheet surface is chemically treated.

(3) The thermosetting resin composition is applied to the front surface, and the thermosetting resin composition is dried to form a low-flow or no-flow resin layer (c). In this case, the resin layer is formed such that the protrusions having the form of a cone leave their top ends slightly lower than the thickness (height) of a metal foil.

(4) A metal foil (d) is placed on the front surface, the high-flow prepreg, the resin sheet, the metal foil with a resin or the applied resin sheet is placed on the reverse surface, a metal foil is placed thereon as required, (5) the resultant set is laminate-formed under heat and pressure and under vacuum, then, (6) a through hole (e) is made in a predetermined position with a drill, a laser, or the like, such that the through hole is not brought into contact with the inner layer of the metal foil, (7) the through hole is desmeared and then plated with a metal, and front-surface and reverse-surface circuits are formed according to a known method. That portion which is not included in the semiconductor-chip (f)-mounting portion and bonding pad portion on the front surface and the solder ball pad portion on the reverse surface is coated with a plating resist (k), the semiconductor-chip (f)-mounting portion and bonding pad portion on the front surface and the solder ball pad portion on the reverse surface are plated with a nickel or gold metal, and a semiconductor chip is bonded to the surface of the semiconductor-chip-mounting portion where the protrusions of the metal sheet as an inner layer are in contact with the metal foil, with a thermally conductive adhesive. Then, wire bonding (h) is carried out, then, encapsulation with a resin (j) is performed, and optionally, solder balls (i) are bonded.

Figure 8:
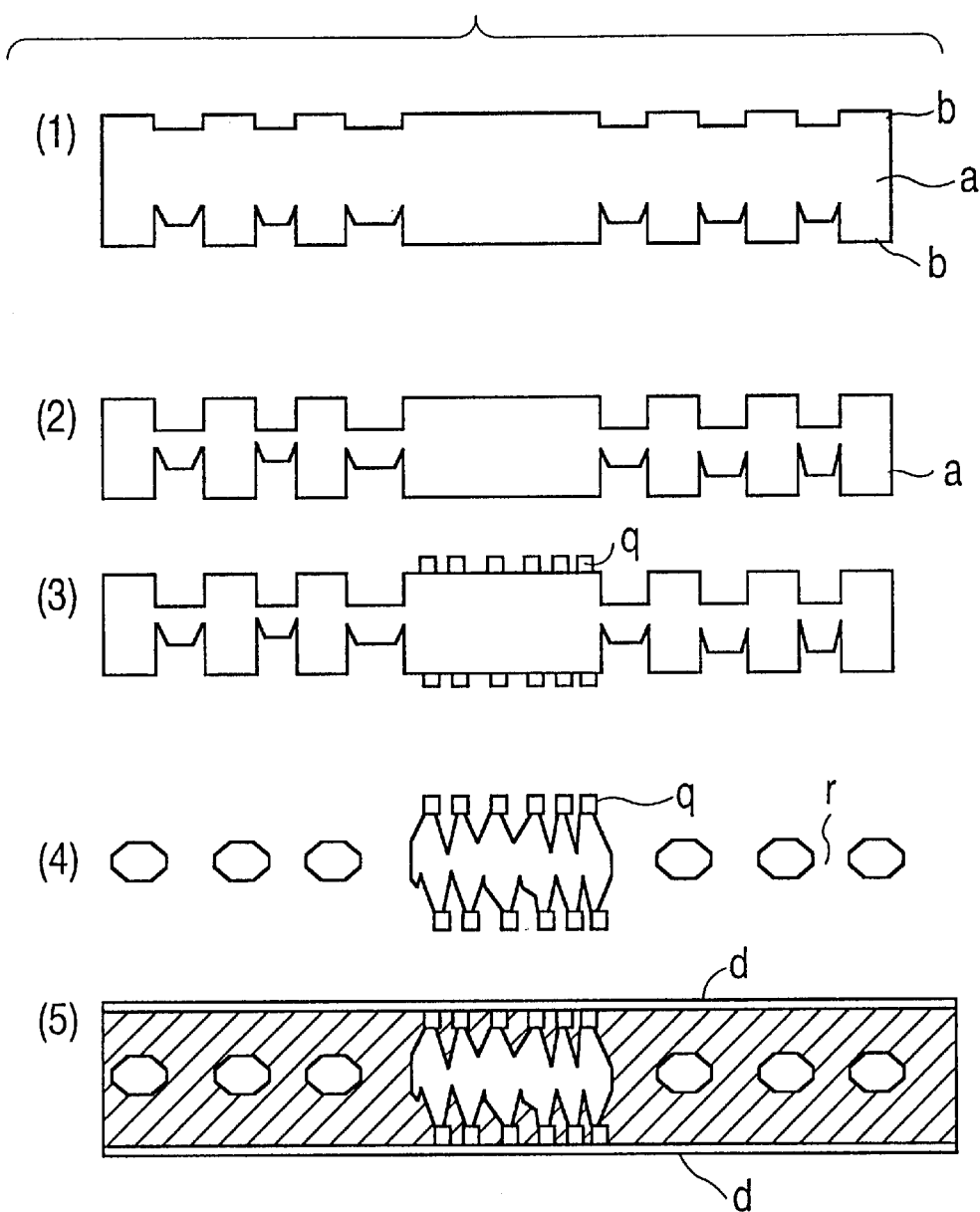
FIG. 8 schematically shows production steps in which solder-bonded protrusions having the form of a frustum of a cone are formed on both planes of a metal sheet and at the same time a clearance hole is made.

According to the present invention, further, there is provided a process for the production of a metal sheet for a metal-sheet-inserted double-side metal-foil-clad laminate for a semiconductor plastic package, the metal-sheet-inserted double-side metal-foil-clad laminate being a printed wiring board to which at least one semiconductor chip is to be fixed and being obtained by placing prepregs of a thermosetting resin composition in a semi-cured state, resin sheets of said thermosetting resin composition, metal foils with said thermosetting resin composition or a layer of said thermosetting resin composition on front and reverse surfaces of a metal sheet having a plurality of metal protrusions having the form of a frustum of a cone and a clearance hole or a slit hole in which a through hole for conduction between the front and reverse surfaces, placing metal foil or foils thereon and laminate-forming the resultant set under heat and pressure, the process comprising placing a solder for forming the protrusions having the form of a frustum of a cone on part of one surface of a metal sheet as a raw material, placing an etching resist for forming the clearance hole or the slit hole by etching on the other surface of the metal sheet material, and simultaneously forming the protrusions having the form of a frustum of a cone and the clearance hole or the slit hole in an etching step of blowing an alkaline etching liquid having a lower pressure to a surface where the protrusions having the form of a frustum of a cone are to be formed and blowing an alkaline etching liquid having a higher pressure to the other surface, to form a printed wiring board having a specially shaped metal sheet inserted therein (see FIG. 8).

In the present invention, first, a metal sheet as a raw material for the metal sheet as an end product is provided, preferably, a lead-free solder is formed on a front surface portion where the protrusions having the form of a frustum of a cone are to be formed, by a printing method, etc., the reverse surface is treated so as to retain an etching resist in portions other than a portion where the clearance hole or slit hole is to be formed, the front surface is etched at a lower pressure, the reverse surface is simultaneously etched at a higher pressure, to form the protrusions having the form of a frustum of a cone and form the clearance hole or slit hole from the reverse surface. The etching liquid is selected from alkaline etching liquids which do not dissolve the solder. The protrusions having the form of a frustum of a cone are formed in a portion corresponding to a metal foil portion where a semiconductor chip is to be fixed, and the size of the protrusions having the form of a frustum of a cone is nearly equivalent to the size of the portion where the semiconductor chip is to be fixed. The pressures for etching the front and reverse surfaces differ depending upon the height of the intended protrusions having the form of a frustum of a cone and the thickness of the metal sheet as a raw material, while the pressure for etching the front surface is in the range of from 0.5 to 1.5 kg/cm$^2$ and the pressure for etching the reverse surface is in the range of from 1.0 to 2.5 kg/cm$^2$.

The metal sheet having the metal protrusions having the form of a frustum of a cone and the clearance or slit hole is surface-treated, as required, according to a known method in which the solder is retained. The metal sheet having the metal protrusions having the form of a frustum of a cone and the clearance or slit hole is entirely coated with a thermosetting resin composition, except the solder-applied top portions of the protrusions having the form of a frustum of a cone, to form an insulation portion. The insulation portion of the thermosetting resin composition is formed by placing prepregs of a thermosetting resin composition in a semi-cured state, resin sheets, metal foils with a resin or a coating composition on the front and reverse surfaces, optionally placing metal foils thereon and laminate-forming the resultant set under heat and pressure and preferably under vacuum. The thickness of the prepregs, or the like is arranged such that the solder on the protrusions having the form of a frustum of a cone is melted to be connected to a metal foil on the surface after a resin is filled in the clearance or slit hole of the laminate-formed board.

Since the clearance hole or the slit hole is liable to be insufficiently filled with a resin, there may be employed a method in which a solvent-free liquid thermosetting resin composition may be flowed into the hole and cured beforehand. In any case, the clearance or slit hole of the metal sheet is filled with the thermosetting resin composition.

At least one through hole is connected directly to the inner layer metal core and used for heat diffusion. Alternatively, a via hole is made in the reverse surface, and the metal sheet and the reverse-surface metal foil are connected with a conductor formed by metal plating or connected by filling a thermally conductive adhesive in the via hole.

In the step of forming circuits on the front and reverse surfaces, the metal foil portion which is the semiconductor-chip-fixing portion and with which the protrusions having the form of a frustum of a cone are in contact is retained. Further, the printed wiring board may be completed by forming a resin layer on the above surface other than the semiconductor-chip-mounting portion, making a via hole with laser or plasma, optionally carrying out desmeared treatment, plasma treatment or near infrared treatment, plating the via hole with a metal, forming circuits and then forming a noble metal plating layer on at least the wire bonding pad surface. In this case, those portions which require no plating with a noble metal are coated with a plating resist in advance. Otherwise, after the plating, at least those surfaces other than the semiconductor-chip-mounting portion, the bonding pad portion and the solder-ball-bonding pad portion on the reverse surface are coated with the thermosetting resin composition or a photo-selective thermosetting resin composition.

The material for use as a layer for forming a blind via portion is generally selected from known materials such as the above prepreg used for reinforcing the substrate, a copper foil with a resin, prepared by applying the thermosetting resin composition to a copper foil and drying it to bring it into a semi-cured state, or a coating composition. The blind via can be generally formed by a known method, and specifically, the method can be selected from a method for making a via hole with carbon dioxide gas laser or plasma or a method for making it by a photo-via method.

The semiconductor chip is fixed to a metal foil portion on the printed wiring board with an adhesive or a metal-powder-containing adhesive, the semiconductor chip and the bonding wire pad of the printed wiring board circuit are connected by a wire bonding method, and at least the semiconductor chip, the bonding wire and the bonding pad are encapsulated with an encapsulation resin.

The solder balls are connected to the solder-ball-bonding pad on the surface opposite to the surface to which the semiconductor chip is fixed, to obtain P-BGA, the solder balls are positioned on the circuit on a mother board printed wiring board and the balls are melted under heat for connection. Otherwise, P-LGA is prepared without attaching the solder balls to the package, and when the package is mounted on a mother board printed wiring board, the solder-ball-connecting conductor pads formed on the surface of the mother board printed wiring board and the conductor pads for solder balls for P-LGA are connected by melting the solder balls under heat.

The solder formed on the metal sheet by a screen printing method, etc., before etching can be selected from known solders. In view of environmental friendliness, a lead-free solder having a melting point of 110 to 250° C. Is preferred. Specific examples thereof include Sn—In, Sn—Bi, Sn—Ag—Bi, Sn—Zn, Sn—Bi—Cu, Sn—Ag—Cu and Sn—Al. Although not specially limited, the method of printing the solder on the metal sheet can be generally a known method in which a metal plate having circular holes is placed on the metal sheet and a molten solder is printed in the holes. Generally, a thermally conductive metal paste having durability against an alkaline etching solution can be also used.

The semiconductor plastic package having the specially shaped metal sheet of the present invention can be produced by the following method.

(1) A plurality of solders having the form a circle each are formed of a lead-free solder on an area corresponding to the semiconductor-chip-mounting portion on the surface of the metal sheet to form an internal layer. A liquid etching resist is retained on portions other than the clearance hole portion on the reverse surface.

(2) The front surface is etched at a low pressure, and the reverse surface is etched at a high pressure, to form a plurality of the protrusions having the form of a frustum of a cone and to simultaneously form a clearance hole having the same diameters in the front and reverse surfaces from the reverse surface, and the etching resist is removed.

(3) Prepregs are placed on the front and reverse surfaces, metal foils are placed thereon and the resultant set is laminate-formed under heat and pressure and under vacuum. Then, a through hole is made in a predetermined position so as not to be in contact with the internal layer formed of the metal sheet, and some through holes are made so as to be brought into contact with the metal sheet and plated with a metal.

(4) Circuits are formed on the front and reverse surfaces by a known method and coated with a plating resist, and then plating with a noble metal is carried out. A semiconductor chip is bonded to the surface of the semiconductor-chip-mounting metal foil portion with a thermally conductive adhesive. Then, the encapsulation is carried out, and solder balls are bonded as required.

In the present invention, the above method of producing the above metal sheet as an end product includes the following variant. The metal sheet as a raw material is etched partially in the thickness direction thereof, then, solders are bonded to the surface where the protrusions having the form of a cone or a frustum of a cone are to be formed and that portion of the reverse surface which corresponds to the above surface, solder-bonded protrusions having the form of a cone or a frustum of a cone are formed with an alkaline etching solution, and at the same time, the clearance hole or the slit hole is made (see FIG. 8).

Further, according to the present invention, there is provided a method of producing a copper-clad sheet for a printed wiring board for a semiconductor plastic package having a structure in which a metal sheet having a size nearly equal to the size of a printed wiring board is disposed nearly in the middle of the thickness direction of the printed wiring board, at least one semiconductor chip is fixed on one surface of the printed wiring board with a thermally conductive adhesive, the metal sheet is insulated from circuits on the front and reverse surfaces of the printed wiring board with a thermosetting resin composition, a circuit conductor formed on the surface of the printed wiring board and the semiconductor chip are connected with each other by wire bonding, a signal propagation circuit conductor on the surface of the printed wiring board and a circuit conductor formed on the reverse surface of the printed wiring board or a circuit conductor pad formed for connection to an external portion of said package with solder balls are at least connected with a through hole conductor insulated from the metal sheet with a resin composition, at least one through hole forms a direct junction with the metal sheet disposed as an inner layer, and at least the semiconductor chip, the bonding wire and the bonding pad are encapsulated, the method comprising placing prepregs or resin sheets on positions of a plurality of metal protrusions which have the form of a cone or a frustum of a cone each and are formed on parts of both surfaces of the metal sheet, the prepregs or resin sheets having holes made slightly greater than the area of the position, placing metal foils thereon, and applying heat and pressure to fill the resin in a clearance hole made in the metal sheet and flow the resin into spaces among a plurality of the metal protrusions, an outermost metal foil being in contact with tops of the metal protrusions.

In the present invention, the metal protrusions having the form of a cone or a frustum of a cone have an area equal to, or smaller than, the area of the semiconductor chip, or generally have an area of which sides are 5 to 20 mm long, and the metal protrusions are formed so as to exist below a portion where the semiconductor chip is to be fixed. The metal protrusions on the other surface also have a similar area, and ball pads are formed in a portion which is not a metal foil portion contacting the metal protrusions. The bonding strength between a ball pad portion and the substrate is secured by connecting the ball pads and the metal foil on the protrusions with a circuit, so that the peel of the balls (ball shear strength) when a pressure is laterally applied can be prevented. The above metal-sheet-inserted copper-clad sheet can be used not only for P-BGA but also for general printed wiring boards such as a stick pin grid array.

Figure 9:
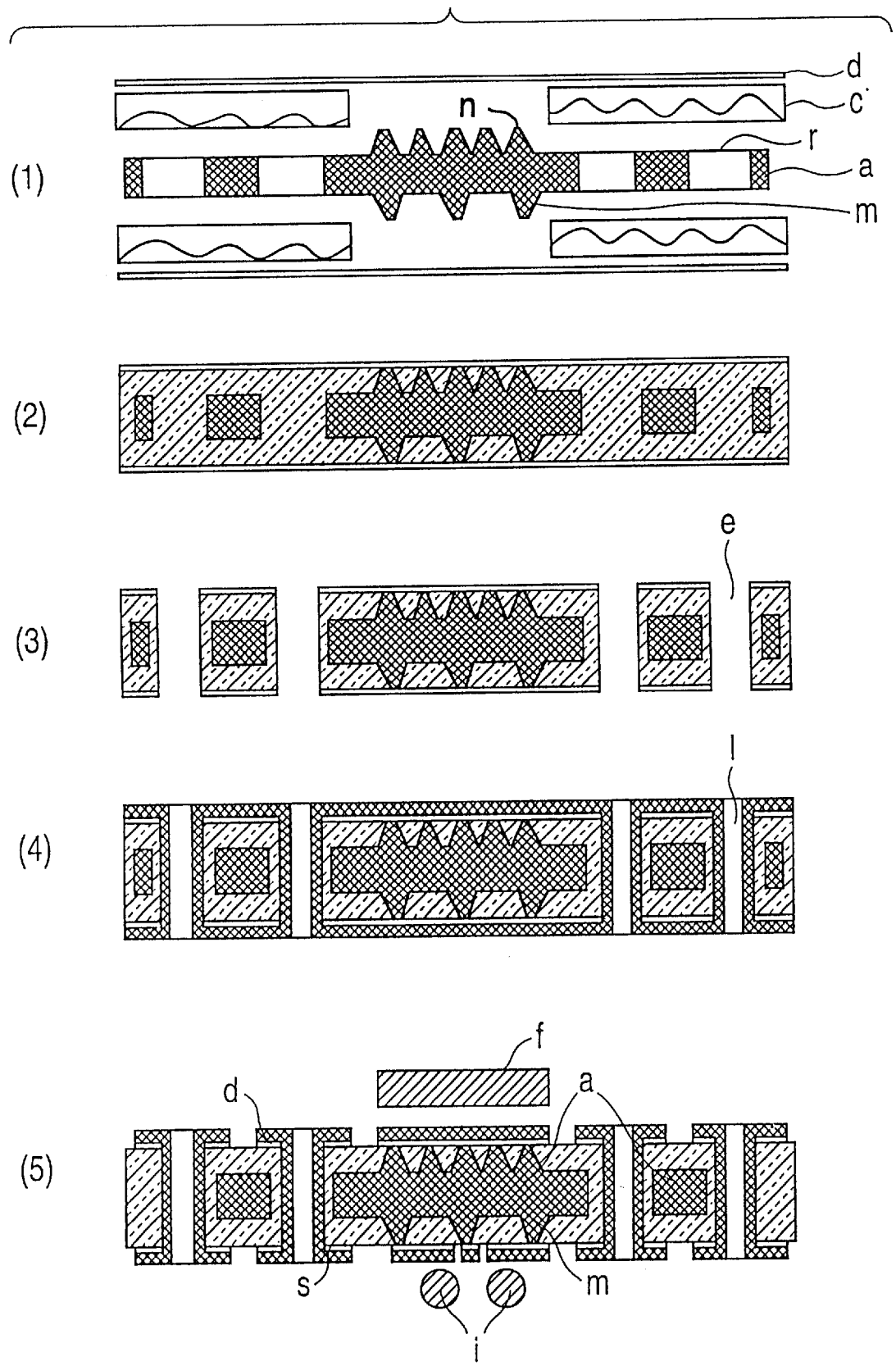
FIG. 9 schematically shows the steps of producing a copper-clad laminate having protrusions having the form of a frustum of a cone, for a printed wiring board, by placing prepregs having holes made beforehand in a form similar to the form of the protrusions.

Although not specially limited, the method of producing the metal-sheet-inserted semiconductor plastic package of the present invention is carried out as follows (FIG. 9).

(1) The entire surface of a metal sheet as a raw material is coated with a liquid etching resist, a solvent is removed by heating the coated metal sheet, then, the metal sheet is etched to a predetermined thickness with retaining the resist on a portion where a semiconductor chip is to be fixed and a reverse surface portion where metal protrusions having the form of a frustum of a cone are to be formed, and then the etching resist is removed. Then, the entire surface of the metal sheet is again coated with an etching resist, and then in areas where the metal protrusions having the form of a frustum of a cone are to be formed, the etching resist is removed with retaining the etching resist in a circular form on those portions of both the surfaces where the metal protrusions having the form of a frustum of a cone are to be formed, and in the other portions, the etching resist in an area for the clearance hole is removed. Then, the front and reverse surfaces are etched with etching solutions having the same pressures to form the protrusions (m,n) having the form of a frustum of a cone and the clearance hole (r) at the same time.

Prepregs (c) or resin sheets having holes slightly greater than the area of the metal protrusions are placed on the front and reverse surfaces, copper foils (d) are placed thereon (Step in FIG. 9(1)), (2) the resultant set is laminate-formed under heat and pressure and under vacuum (Step in FIG. 9(2)), (3) a through hole (e) is drilled (Step in FIG. 9(3), (4) the entire surface is plated with copper (Step in FIG. 9(4)), (5) A copper foil is applied to the entire front surface, the copper foil on the protrusions having the form of a frustum of a cone being used as a semiconductor-chip-mounting portion, solder ball pads are formed on the reverse surface so as not to exist on the protrusions having the form of a frustum of a cone, the ball pads are directly connected to the copper foil on the metal protrusions to form an entire circuit, and plating with nickel and plating with gold are carried out to obtain a printed wiring board.

(6) A semiconductor chip (f) is fixed to the front surface with a silver paste, wire bonding is carried out, and then, at least the semiconductor chip, wires and the wire bonding pads are encapsulated. On the reverse surface, solder balls are bonded to pads by melting them, to form a semiconductor plastic package.

EFFECT OF THE INVENTION

In the present invention, a plurality of the metal protrusions having the form of a cone or a frustum of a cone are formed on the semiconductor-chip-mounting portion of the metal sheet constituting part of a printed wiring board, and top portions of the metal protrusions are in contact with a thermally conductive adhesive or a metal foil on which a semiconductor chip is mounted. As a result, the absorption of moisture from a surface below the semiconductor chip so that the heat resistance after moisture absorption can be remarkably improved, i.e., that the popcorn phenomenon can be overcome. Moreover, the semiconductor plastic package can be improved in heat diffusibility, is excellent in the reliability of connection between the metal sheet and the surface metal foil and is feasible for mass production, and a semiconductor plastic package having improved economic performances and having a novel structure is therefore provided.

In the present invention, heat generated in a semiconductor chip is transmitted to a mother board printed wiring board through a metal foil or a metal plating, the metal protrusions having the form of a cone or a frustum of a cone and solder balls on the reverse surface, and a semiconductor plastic package having excellent heat diffusibility and having a novel structure is therefore provided.

In the present invention, the metal protrusions having the form of a cone or a frustum of a cone may be also provided on the reverse surface, and in this case, heat generated in a semiconductor chip is transmitted to a mother board printed wiring board through the metal protrusions on the reverse surface and solder balls connected to a metal foil, and a semiconductor plastic package having excellent heat diffusibility and having a novel structure is therefore provided.

In the present invention, there is provided a semiconductor plastic package which is excellent in the reliability of connection between the metal sheet and the front-surface metal foil, which is free from absorption of moisture from a surface below a semiconductor chip and which is excellent in heat resistance after moisture absorption, heat diffusibility, economic performances and mass productivity, a metal sheet for the above semiconductor plastic package and a copper-clad laminate for which the metal sheet is applied.

EXAMPLES

The present invention will be more specifically explained with reference to Examples and Comparative Examples hereinafter, in which "part" stands for "parts by weight" unless otherwise specified.

Example 1

900 Parts of 2,2-bis(4-cyanatophenyl)propane and 100 parts of bis(4-maleimide phenyl)methane were melted at 150° C. And allowed to react for 4 hours with stirring, to obtain a prepolymer.

The above prepolymer was dissolved in mixed solvents of methyl ethyl ketone and dimethylformamide. To the resultant solution were added 400 parts of a bisphenol A type epoxy resin (trade name: Epitome 1001, supplied by Yuba-Shell Epoxy K.K.) And 600 parts of a cresol novolak type epoxy resin (trade name: ESC-220F, supplied by Summit Chemical Co., Ltd.), and these were homogeneously dissolved in the solution. To the resultant solution was added 500 parts of an inorganic filler (trade name: Calcined talc, supplied by Nippy Talc K.K.), and the mixture was homogeneously stirred to give a varnish A.

A glass woven fabric having a thickness of 100 $\mu$m was impregnated with the above varnish, and the varnish was dried at 150° C. To obtain a 107 $\mu$m thick semi-cured low-flow prepreg (prepreg B) having a relation time of 7 seconds (at 170° C.) And a resin flow of 110 $\mu$m at 170° C. At 20 kg/cm$^2$ for 5 minutes. Separately, a 107 $\mu$m thick high-flow prepreg (prepreg C) having a relation time of 120 seconds and a resin flow of 13 mm was also prepared.

Separately, a copper sheet having a thickness of 300 $\mu$m was provided for an internal-layer metal sheet, a liquid etching resist was applied to the front and reverse surfaces of the copper sheet to form 25 $\mu$m thick coatings, and the coatings were dried. A negative film, which was designed so as to retain circular resists having a diameter of 150 $\mu$m each at intervals of 1 mm in a 13 mm×13 mm central square region in a 50 mm×50 mm square package, was covered on the front surface, and a negative film, which was designed so as to remove a resist from a clearance hole portion, was covered on the reverse surface. The resultant sheet was exposed to ultraviolet light, unexposed portions were removed with a 1% sodium carbonate aqueous solution, and both the surfaces were etched to form 144 protrusions having a height of 100 $\mu$m and having the form of a frustum of a cone and make clearance holes having a diameter of 0.6 mm.

The entire surface of the metal sheet was treated to form black copper oxide, and the above varnish A was applied so as to retain 10 $\mu$m high top portions of the protrusions having the form of a cone and dried to form resin layers having a relation time of 30 seconds (at 170° C.)

Further, the above prepreg B was placed on the reverse surface, 12 $\mu$m thick electrolytic copper foils were placed on both the surfaces, and the resultant set was laminate-formed at 200° C. At 20 kg/cm$^2$ under a vacuum of 30 mmHg or lower for 2 hours to integrate the above components.

In the clearance hole portion, a through hole having a diameter of 0.25 mm was drilled in the center thereof so as not to bring it into contact with the metal of the clearance hole portion. Through holes for heat diffusion were made in four corners of package so as to be in contact with the internal-layer metal sheet. These through holes were desmeared and then plated with copper by electroless plating and electroplating to form copper plating layers having a thickness of 17 μm each.

A liquid etching resist was applied to the front and reverse surfaces and dried, and then positive films were placed thereon, followed by exposure and development, to form front-surface and reverse-surface circuits. Plating resists were formed on portions different from any one of a semiconductor-chip-mounting portion, a bonding pad portion and a ball pad portion, and those portions were plated with nickel and gold, to complete a printed wiring board.

A semiconductor chip having a square size of 13 mm×13 mm was bonded and fixed to a front-surface portion where the protrusions having the form of a cone were in contact with the copper foil, with a silver paste, wire bonding was carried out, and the semiconductor chip, wires and bonding pads were encapsulated with a sealing silica-containing epoxy liquid resin. The solder balls were bonded to obtain a semiconductor plastic package (FIG. 2 (7-2)). The semiconductor plastic package was bonded to an epoxy resin mother board printed wiring board by melting the solder balls. The semiconductor plastic package was evaluated, and Table 1 shows the results.

Example 2

A 200 μm thick alloy sheet containing 99.9% by weight of Cub, 0.07% by weight of Fe and 0.03% by weight of P was provided for an internal layer. An etching resist was applied to both the surfaces of the alloy sheet to form coatings having a thickness of 20 μm, and the coatings were dried. Negative films for retaining clearance hole portions unexposed are covered on the front and reverse surfaces, the etching resist was exposed to ultraviolet light, and an-unexposed portion was removed with a 1% sodium carbonate aqueous solution. Both the surfaces were etched to make a clearance hole having a diameter of 0.6 mm.

In a region having a square size of a 13 mm×13 mm in the center of the clearance hole, 100 protrusions having the form of a cone and having a height of 100 μm were formed with a copper paste in a dispenser and cured by heating, and the metal sheet was entirely treated to form black oxide, whereby a metal sheet D was obtained.

On the other hand, the above varnish A was applied to an electrolytic copper foil so as to form a coating having a thickness of 93 μm and dried, to obtain a low-flow resin-coated copper foil (laminating material E) having a relation time of 10 seconds (at 170° C.). Further, a high-flow resin-coated copper foil (laminating material F) having a relation time of 65 seconds.

A hole having a size slightly greater than the area where a semiconductor chip was to be mounted was made in the above laminating material E by punching, and the laminating material E was placed on one surface of the above metal sheet D. The laminating material F was placed on the other surface, and the resultant set was laminate-formed under the same conditions as those in Example 1.

A through hole having a diameter of 0.20 mm drilled in the center of the clearance hole portion so as not to be in contact with the metal of the clearance hole portion, and after desmeared treatment, the through hole was plated with copper by electroless plating and electroplating, to form a 17 μm thick copper plating layer on the inner wall surface of the through hole.

A liquid etching resist was applied to the front and reverse surfaces and dried to remove a solvent, and positive films were placed, followed by exposure and development, to form front-surface and reverse-surface circuits. The procedures thereafter were carried out in the same manner as in Example 1, to complete a printed wiring board. Then, a semiconductor chip was bonded, wire bonding was carried out and encapsulation with a resin was carried out in the same manner as in Example 1, to form a semiconductor plastic package (FIG. 2(7-1)). The semiconductor plastic package was bonded to a mother board. Table 1 shows the evaluation results thereof.

Comparative Example 1

Figure 10:
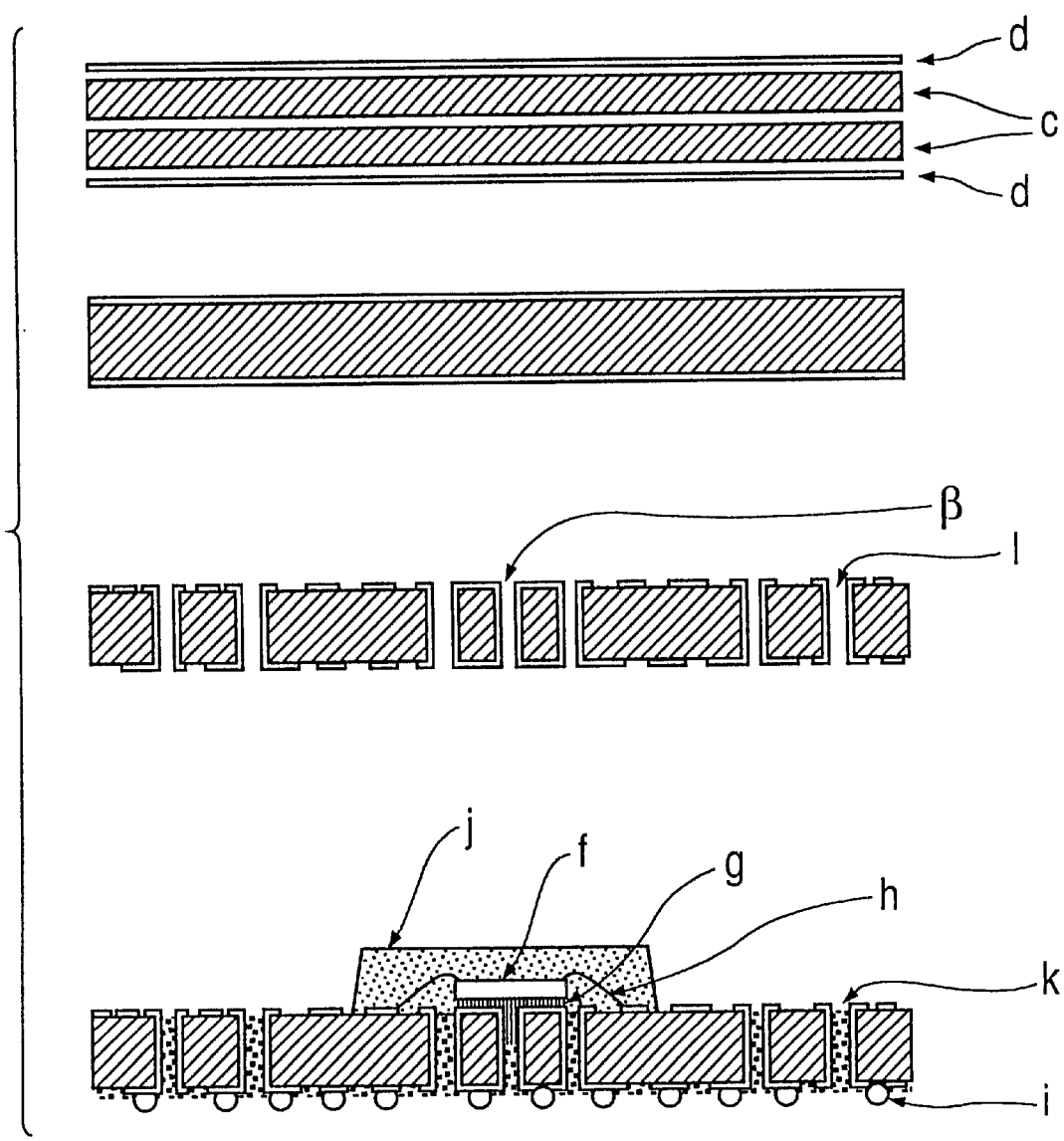
FIG. 10 schematically shows the steps of producing a semiconductor plastic package in Comparative Example 1.

Two prepregs which were the same as the prepreg C in Example 1 were used, 12 μm thick electrolytic copper foils were placed on front and reverse surfaces of the combined prepregs, and the resultant set was laminate formed at 200° C. At 20 kg/cm² under a vacuum of 30 mmHg or lower for 2 hours, to give a double-side copper-clad laminate. A through hole having a diameter of 0.25 mm was drilled in a predetermined position, and after desmeared treatment, the through hole was plated with copper. Circuits were formed on the front and reverse surfaces of the obtained board, and after the board was covered with a plating resist, plating with nickel and gold was carried out. The board had the through hole for heat diffusion formed in a semiconductor-chip-mounting portion, and a semiconductor chip was bonded thereto with a silver paste. Wire bonding was carried out, then, an epoxy sealing compound was used to carry out the same encapsulation as that in Example 1, and solder balls were bonded (FIG. 10). the resultant semiconductor plastic package was bonded to a other board in the same manner as in Example 1. Table 1 shows the evaluation results thereof.

Comparative Example 2

600 Parts of an epoxy resin (trade name: Epitome 1045), 400 parts of an epoxy resin (trade name: ESCN220F). 300 parts of dicyandiamide and 2 parts of 2-ethyl-4-methylimidazole were uniformly dissolved in mixed solvents of meethyl ethyl ketone and dimethylformamide, and the resultant solution was used to impregnate a 100 μm thick glass woven fabric with it and dried to obtain a no-flow prepreg (prepreg G) having a gelation time of 10 seconds (at 170° C.) and a resin flow of 98 μm and a high-flow prepreg (prepreg H) having a gelation time of 150 seconds and a resin flow of 18 mm.

Figure 11:
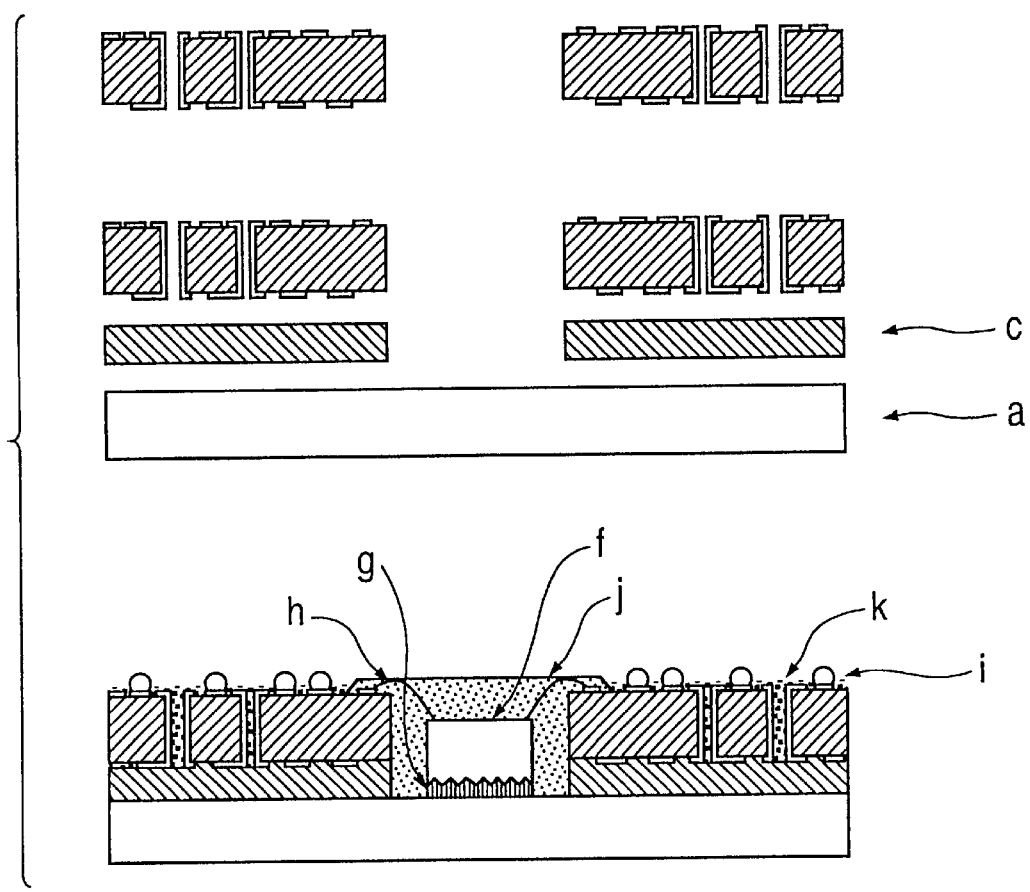
FIG. 11 schematically shows the steps of producing a semiconductor plastic package in Comparative Example 2.

Two sheets of the prepreg H were used, and a double-side copper-clad laminate was obtained by carrying out laminate-formation at 170° C. at 20 kg/cm² under a vauum of 30 mmHg or lower for 2 hours. Thereafter, a printed wiring board was obtained in the same manner as in Comparative Example 1, a semiconductor-chip-mounting portion was bored in the board, and a 200 μm thick copper sheet was similarly bonded to the reverse surface with the above no-flow prepreg G which was punched out, under heat and pressure, to obtain a printed wiring board with a heat sink. The board was distorted to some extent. A semiconductor chip was bonded directly to the above heat sink with a silver paste, connected by wire bonding and encapsulated with a liquid epoxy resin (FIG. 11). The resultant package was bonded to a mother board printed wiring board in the same manner as in Example 1. Table 1 shows the evaluation results thereof.

TABLE 1

| | | Example 1 | Example 2 | CEx. 1 | CEx. 2 |
|---|---|---|---|---|---|
| Heat resistance ① after moisture absorption | Ordinary state | No failure | No failure | No failure | No failure |
| | 72 hours | No failure | No failure | No failure | N6 failure |
| | 96 hours | No failure | No failure | No failure | partly peeled |
| | 120 hours | No failure | No failure | partly peeled | partly peeled |
| | 144 hours | No failure | No failure | Partly peeled | partly peeled |
| | 168 hours | No failure | No failure | " | Partly peeled |
| Heat resistance ② after moisture absorption | Ordinary state | No failure | No failure | No failure | No failure |
| | 24 hours | No failure | No failure | Partly peeled | partly peeled |
| | 48 hours | No failure | No failure | largely peeled | largely peeled |
| | 72 hours | No failure | No failure | Wire broken | Wire broken |
| | 96 hours | No failure | No failure | Wire broken | Wire broken |
| | 120 hours | No failure | No failure | Wire broken | Wire broken |
| | 144 hours | No failure | No failure | — | — |
| | 168 hours | No failure | No failure | — | — |
| GTT | (° C.) | 234 | 235 | 234 | 145 |
| Insulation resistance (Ω) after pressure cooker test | Ordinary state | $4 \times 10^{14}$ | $5 \times 10^{14}$ | $4 \times 10^{14}$ | $5 \times 10^{14}$ |
| | 200 hours | $6 \times 10^{12}$ | $4 \times 10^{12}$ | $4 \times 10^{12}$ | $2 \times 10^{4}$ |
| | 500 hours | $6 \times 10^{11}$ | $3 \times 10^{11}$ | $3 \times 10^{11}$ | $<10^{8}$ |
| | 700 hours | $5 \times 10^{10}$ | $5 \times 10^{10}$ | $2 \times 10^{10}$ | |
| | 1000 hours | $2 \times 10^{10}$ | $3 \times 10^{10}$ | $1 \times 10^{10}$ | |
| Migration resistance (Ω) | Ordinary state | $5 \times 10^{11}$ | $6 \times 10^{13}$ | $5 \times 10^{10}$ | $6 \times 10^{13}$ |
| | 200 hours | $4 \times 10^{11}$ | $4 \times 10^{11}$ | $6 \times 10^{11}$ | $3 \times 10^{11}$ |
| | 500 hours | $3 \times 10^{11}$ | $3 \times 10^{11}$ | $3 \times 10^{11}$ | $<10^{8}$ |
| | 700 hours | $1 \times 10^{11}$ | $2 \times 10^{11}$ | $1 \times 10^{11}$ | |
| | 1000 hours | $9 \times 10^{10}$ | $1 \times 10^{11}$ | $8 \times 10^{10}$ | |
| Heat diffusibility | (° C.) | 37 | 39 | 57 | 48 |

CEx. = Comparative Example
GTT = Glass transition temperature

<Measuring Methods>
1) Heat resistance ① after moisture absorption: JEDEC STANDARD TEST METHOD A113-A LEVEL 3: After treatment at 30° C. at 60% RH for a predetermined period of time, and after 3 cycles of 220° C. reflow soldering, a substrate was evaluated for failures by observing its cross section and electric checking.
2) Heat resistance ② after moisture absorption: JEDEC STANDARD TEST METHOD A113-A LEVEL 2: After treatment at 85° C. at 60% RH for a predetermined period of time (max. 168 hours), and after 3 cycles of 220° C. reflow soldering, a substrate was evaluated for failures by observing its cross section and electric checking.
3) Glass transition temperature: Measured by DMA method.
4) Insulation resistance value after treatment with pressure cooker: An inter-terminal (line/space=70/70 μm) comb type pattern was prepared, each prepreg used was placed thereon and the resultant set was similarly laminate-formed to obtain a sample. The sample was treated at 121° C. under two atmospheric pressures for a predetermined period of time and then treated at 25° C. at 60% RH for 2 hours, and after 500 V DC was applied for 60 seconds, an insulation resistance value between terminals was measured.
5) Migration resistance: The test sample in the above 4) was measured for an insulation resisance value between terminals at 85° C. at 85% RH under an applied charge of 500 V DC.
6) Heat diffusibility
A package was bonded to a mother board printed wiring board with solder balls and continuously used for 1,000 hours, and the package was measured for a temperature.

Example 3

A varnish A was prepared in the same manner as in Example 1. The varnish A was applied to a 100 μm thick glass woven fabric and dried so as to attain a gelation time of 50 seconds (at 170° C.) and a resin flow of 10 mm at 170° C. at 20 kgf/cm² for 5 minutes, whereby a semi-cured prepreg I having an insulation layer thickness of 83 μm was obtained.

Separately, a 200 μm thick alloy sheet containing 99.9% by weight of Cu, 0.07% by weight of Fe and 0.03% by weight of P was provided for an internal layer. A liquid etching resist was applied to both the surfaces of the alloy sheet to form coatings having a thickness of 25 μm, and the coatings were dried. A negative film for retaining circular resists having a diameter of 150 μm at width intervals of 2 mm in a central 13 mm×13 mm square area in a package having a size of 50 mm×50 mm was covered on the front surface, a negative film for removing the resist in a clearance hole portion was covered on the reverse surface, the etching resist was exposed to ultraviolet light, and an unexposed portion was removed with a 1% sodium carbonate aqueous solution. Both the surfaces were etched to form 25 protrusions having the form of a frustum of a cone and having a height of 85 μm and make a clearance hole having a diameter of 0.6 mm at the same time.

The entire surface of the metal sheet was treated to form black copper oxide, a solder paste was applied onto the protrusions having the form of a frustum of a cone, sheets of the above prepreg I were placed on the reverse and front surfaces, 12 μm thick electroplated copper foils were placed on both the surfaces, and the resultant set was laminate-formed at 200° C. at 20 kg/cm² under a vacuum of 30 mmHg or lower for 2 hours to integrate the above components. In the clearance hole portion, a through hole having a diameter of 0.25 mm was drilled in the center thereof so as not to bring it into contact with the metal of the clearance hole portion. Through holes for heat diffusion were made in four corners so as to be in contact with the internal-layer metal sheet of package.

Copper plating was carried out by electroless plating and electroplating to form a 17 μm thick copper plating layer on the inner wall of each through hole???. An etching resist was applied to the front and reverse surfaces, and then positive films were placed thereon, followed by exposure and development, to form front-surface and reverse-surface circuits. Plating resists were formed on portions different from any one of a semiconductor-chip-mounting portion, a bonding pad portion and a ball pad portion, and those portions were plated with nickel and gold, to complete a printed wiring board.

A semiconductor chip having a square size of 13 mm×13 mm was bonded and fixed to a semiconductor-mounting portion where the front-surface protrusions having the form of a frustum of a cone were in contact with the copper foil, with a silver paste, wire bonding was carried out, and the semiconductor chip, wires and bonding pads were encapsulated with a sealing silica-containing epoxy liquid resin. The solder balls were bonded to obtain a semiconductor plastic package. The semiconductor plastic package was bonded to an epoxy resin mother board printed wiring board by melting the solder balls. The semiconductor plastic package was evaluated in the same manner as in Example 1, and Table 2 shows the results.

Example 4

A varnish A was prepared in the same manner as in Example 1. A 100 μm thick glass woven fabric was impregnated with the varnish A, and the impregnated glass woven fabric was dried so as to attain a gelation time of 50 seconds (at 170° C.) and a resin flow of 10 mm at 170° C. at 20 kgf/cm² for 5 minutes, whereby a semi-cured prepreg J having an insulation layer thickness of 110 μm was obtained.

Separately, a 200 μm thick alloy sheet containing 99.9% by weight of Cu, 0.07% by weight of Fe and 0.03% by weight of P was provided for an internal layer. A liquid etching resist was applied to both the surfaces of the alloy sheet to form coatings having a thickness of 25 μm, and the coatings were dried. A negative film for retaining circular resists having a diameter of 200 μm in a central 13 mm×13 mm square area in a package having a size of 50 mm×50 mm was covered on the front surface, a negative film for removing the resist in a clearance hole portion was covered on the reverse surface, the etching resist was exposed to ultraviolet light, and an unexposed portion was removed with a 1% sodium carbonate aqueous solution. Both the surfaces were etched to form 25 protrusions having the form of a frustum of a cone and having a height of 100 μm, a bottom diameter of 720 μm and a top diameter of 74 μm and make a clearance hole having a diameter of 0.6 mm at the same time.

The entire surface of the metal sheet was treated to form black copper oxide, and the above varnish A was applied to the upper surface and dried to form a semi-cured resin layer. The prepreg J was placed on the reverse surface, 12 μm thick electrolytic copper foils were placed on both the surfaces, and the resultant set was laminate-formed at 200° C. at 20 kg/cm² under a vacuum of 30 mmHg or lower for 2 hours to integrate the above components.

In the clearance hole portion, a through hole having a diameter of 0.25 mm was drilled in the center thereof so as not to bring it into contact with the metal of the clearance hole portion. ???Through holes for heat diffusion were made in four corners so as to be in contact with the internal-layer metal sheet.

The metal foil on the metal protrusions having the form of a frustum of a cone was removed by etching so as to make a hole having a diameter of 0.5 mm, and the hole was desmeared and plated with copper by electroless plating and electroplating to form a 17 μm thick copper plating layer on the internal wall of the hole.

An etching resist was applied to the front and reverse surfaces, and then positive films were placed thereon, followed by exposure and development, to form front-surface and reverse-surface circuits. Plating resists were formed on portions different from any one of a semiconductor-chip-mounting portion, a bonding pad portion and a ball pad portion, and those portions were plated with nickel and gold, to complete a printed wiring board.

A semiconductor chip having a square size of 13 mm×13 mm was bonded and fixed to a semiconductor-mounting portion where the front-surface protrusions having the form of a frustum of a cone were exposed and coated with a thin copper plating layer and the other copper foil portion, with a silver paste, wire bonding was carried out, and the semiconductor chip, wires and bonding pads were encapsulated with a sealing silica-containing epoxy liquid resin. The solder balls were bonded to obtain a semiconductor plastic package. The semiconductor plastic package was bonded to an epoxy resin mother board printed wiring board by melting the solder balls. The semiconductor plastic package was evaluated in the same manner as in Example 1, and Table 2 shows the results.

TABLE 2

|  |  | Example 3 | Example 4 |
|---|---|---|---|
| Heat resistance ① after moisture absorption | Ordinary state | No failure | No failure |
|  | 72 hours | No failure | No failure |
|  | 96 hours | No failure | No failure |
|  | 120 hours | No failure | No failure |
|  | 144 hours | No failure | No failure |
|  | 168 hours | No failure | No failure |
| Heat resistance ② after moisture absorption | Ordinary state | No failure | No failure |
|  | 24 hours | No failure | No failure |
|  | 48 hours | No failure | No failure |
|  | 72 hours | No failure | No failure |
|  | 96 hours | No failure | No failure |
|  | 120 hours | No failure | No failure |
|  | 144 hours | No failure | No failure |
|  | 168 hours | No failure | No failure |
| GTT | (° C.) | 234 | 234 |
| Insulation resistance (Ω) after pressure cooker treatment | Ordinary state | $4 \times 10^{14}$ | $4 \times 10^{14}$ |
|  | 200 hours | $6 \times 10^{12}$ | $8 \times 10^{12}$ |
|  | 500 hours | $6 \times 10^{11}$ | $6 \times 10^{11}$ |
|  | 700 hours | $5 \times 10^{10}$ | $4 \times 10^{10}$ |
|  | 1000 hours | $2 \times 10^{10}$ | $2 \times 10^{10}$ |
| Migration resistance (Ω) | Ordinary state | $5 \times 10^{13}$ | $6 \times 10^{13}$ |
|  | 200 hours | $4 \times 10^{11}$ | $5 \times 10^{11}$ |
|  | 500 hours | $3 \times 10^{11}$ | $4 \times 10^{11}$ |
|  | 700 hours | $1 \times 10^{11}$ | $1 \times 10^{11}$ |
|  | 1000 hours | $9 \times 10^{10}$ | $9 \times 10^{10}$ |
| Heat diffusibility | (° C.) | 36 | 36 |

GTT = Glass transition temperature

Example 5

A varnish A was prepared in the same manner as in Example 1. A 100 μm thick glass woven fabric was impregnated with the varnish A, and the impregnated glass woven fabric was dried so as to attain a gelation time of 50 seconds (at 170° C.) and a resin flow of 10 mm at 170° C. at 20 kgf/cm² for 5 minutes, whereby a semi-cured prepreg K having an insulation layer thickness of 107 μm was obtained.

Separately, a 350 μm thick alloy sheet containing 99.9% by weight of Cu, 0.07% by weight of Fe and 0.03% by weight of P was provided for an internal layer. A liquid etching resist was applied to both the surfaces of the alloy sheet to form coatings having a thickness of 25 μm, and the coatings were dried. The coatings were exposed to ultraviolet light so as to retain etching resist in a portion other than a clearance hole portion in an area which was to form a 50 mm×50 mm package, and the resist in the clearance hole portion was removed with a 1% sodium carbonate aqueous solution. The front and reverse surfaces were etched to a depth of about 65 μm in both the surfaces. The etching resist was removed. Then, a liquid etching resist was again applied, negative films for retaining circular resist patterns having a diameter of 300 μm at intervals of 2 mm in a central 13 mm×13 mm square area in each surface of the metal sheet was covered on the both the surfaces, the resists were exposed to ultraviolet light, unexposed portions were removed with a 1% sodium carbonate aqueous solution. Both the surfaces were etched to form 25 protrusions having the form of a frustum of a cone and having a height of 114 μm, a bottom diameter of 620 μm and a top diameter of 74 μm on each surface and make a clearance hole having a diameter of 0.6 mm at the same time.

The entire surface of the metal sheet was treated to form black copper oxide. The prepreg K sheets were placed on the front and reverse surfaces, 12 μm thick electrolytic copper foils were placed thereon, and the resultant set was laminate-formed at 200° C. at 20 kg/cm² under a vacuum of 30 mmHg or lower for 2 hours to integrate the above components.

In the clearance hole portion, a through hole having a diameter of 0.25 mm was drilled in the center thereof so as not to bring it into contact with the metal of the clearance hole portion. The through hole was placed with copper by electroless plating and electroplating, to form a 17 μm thick copper plating layer on the internal wall of the through hole.

An etching resist was applied to the front and reverse surfaces, and then positive films were placed thereon, followed by exposure and development, to form front-surface and reverse-surface circuits. Plating resists were formed on portions different from any one of a semiconductor-chip-mounting portion, a bonding pad portion and a ball pad portion, and those portions were plated with nickel and gold, to complete a printed wiring board.

A semiconductor chip having a square size of 13 mm×13 mm was bonded and fixed to a semiconductor-mounting portion where the front-surface protrusions having the form of a frustum of a cone were in contact with the front-surface copper foil, with a silver paste, wire bonding was carried out, and the semiconductor chip, wires and bonding pads were encapsulated with a sealing silica-containing epoxy liquid resin. Solder balls were bonded to obtain a semiconductor plastic package. The semiconductor plastic package was bonded to an epoxy resin mother board printed wiring board by melting the solder balls. The semiconductor plastic package was evaluated in the same manner as in Example 1. Table 3 shows the results.

Example 6

In Example 5, the height of the protrusions having the form of a frustum of a cone on each surface was changed to 109 μm, a silver paste was applied to the protrusions to form tops having a height of 5 μm, sheets of the prepreg L were placed on both the surfaces, 12 μm thick electrolytic copper foils are placed thereon, and the resultant set was laminate-formed at 200° C. at 20 kgf/cm² under vacuum for 2 hours to integrate the components. Thereafter, a printed wiring board was prepared in the same manner as in Example 5, and a semiconductor chip was bonded, wire bonding was carried out, and encapsulation was carried out, in the same manner as in Example 5, to obtain a semiconductor plastic package. The package was similarly bonded to an epoxy resin mother board printed wiring board. Table 3 shows the results of evaluation thereof.

Example 7

A varnish A was prepared in the same manner as in Example 1. The varnish A was applied to a 80 μm thick glass woven fabric and dried so as to attain a gelation time of 50 seconds (at 170° C.) and a resin flow of 10 mm at 170° C. at 20 kgf/cm² for 5 minutes, whereby a semi-cured prepreg M having an insulation layer thickness of 107 μm was obtained.

Separately, a 400 μm thick alloy sheet containing 99.9% by weight of Cu, 0.07% by weight of Fe and 0.03% by weight of P was provided for an internal layer. An etching resist was retained in a semiconductor-chip-mounting portion for a package having a 50 mm×50 mm square size on the front surface and a corresponding portion on the reverse surface, and both the surfaces of the alloy sheet were etched to a depth of 105 μm each to form central convex portions. A liquid etching resist was applied to the resultant entire surfaces to form coatings having a thickness of 25 μm, and the etching resist in a clearance hole portion was removed while retaining a circular etching resist having a diameter of 300 μm in the central portion which was to form protrusions having the form of a frustum of a cone in the semiconductor-chip-mounting portion, the front and reverse surfaces of the alloy sheet were etched to form 400 protrusions having the form of a frustum of a cone and having a height of 114 μm, a bottom diameter of 658 μm and a top diameter of 102 μm in a central 13 mm×13 mm square area on each surface and make a clearance hole having a diameter of 0.6 mm at the same time.

The entire surface of the metal sheet was treated to form black copper oxide. The prepreg L sheets were placed on the front and reverse surfaces, 12 μm thick electroplated copper foils were placed thereon, and the resultant set was laminate-formed at 200° C. at 20 kg/cm² under a vacuum of 30 mmHg or lower for 2 hours to integrate the above components. An etching resist was applied to the front and reverse surfaces, the resist only on central portions having the form of a frustum of a cone was removed by etching the portions having a diameter of 150 μm, and the exposed surfaces were desmeared. A through hole having a diameter of 0.25 mm was drilled, and the entire surface was plated with copper by electroless plating and electroplating to form a 17 μm thick copper plating layer on the internal surface of the through hole. Circuits were formed on the front and reverse surfaces according to a known method, a plating resist was applied to portions other than any one of a semiconductor-chip-mounting portion, a bonding pad portion and a ball pad portion, and nickel plating and gold plating were carried out to complete a printed wiring board.

A semiconductor chip having a square size of 13 mm×13 mm was bonded and fixed to the semiconductor-mounting portion where the front-surface protrusions having the form of a frustum of a cone were in contact with the copper plating, with a silver paste, wire bonding was carried out, and the semiconductor chip, wires and bonding pads were encapsulated with a sealing silica-containing epoxy liquid resin. Solder balls were bonded to obtain a semiconductor plastic package. The semiconductor plastic package was bonded to an epoxy resin mother board printed wiring board by melting the solder balls. The semiconductor plastic package was evaluated in the same manner as in Example 1. Table 3 shows the results.

TABLE 3

| | | Example 5 | Example 6 | Example 7 |
|---|---|---|---|---|
| Heat resistance ① after moisture absorption | Ordinary state | No failure | No failure | No failure |
| | 24 hours | No failure | No failure | No failure |
| | 48 hours | No failure | No failure | No failure |
| | 72 hours | No failure | No failure | No failure |
| | 96 hours | No failure | No failure | No failure |
| | 120 hours | No failure | No failure | No failure |
| | 144 hours | No failure | No failure | No failure |
| | 168 hours | No failure | No failure | No failure |
| Heat resistance ② after moisture absorption | Ordinary state | No failure | No failure | No failure |
| | 24 hours | No failure | No failure | No failure |
| | 48 hours | No failure | No failure | No failure |
| | 72 hours | No failure | No failure | No failure |
| | 96 hours | No failure | No failure | No failure |
| | 120 hours | No failure | No failure | No failure |
| | 144 hours | No failure | No failure | No failure |
| | 168 hours | No failure | No failure | No failure |
| GTT | (° C.) | 234 | 234 | 234 |
| Insulation resistance ($\Omega$) after pressure cooker treatment | Ordinary state | $5 \times 10^{14}$ | $5 \times 10^{14}$ | $4 \times 10^{14}$ |
| | 200 hours | $7 \times 10^{12}$ | $6 \times 10^{12}$ | $8 \times 10^{12}$ |
| | 500 hours | $6 \times 10^{11}$ | $5 \times 10^{11}$ | $6 \times 10^{11}$ |
| | 700 hours | $5 \times 10^{10}$ | $7 \times 10^{10}$ | $4 \times 10^{10}$ |
| | 1000 hours | $2 \times 10^{10}$ | $2 \times 10^{10}$ | $2 \times 10^{10}$ |
| Miigration resistance ($\Omega$) | Ordinary state | $6 \times 10^{3}$ | $5 \times 10^{13}$ | $6 \times 10^{13}$ |
| | 200 hours | $5 \times 10^{11}$ | $6 \times 10^{11}$ | $5 \times 10^{11}$ |
| | 500 hours | $4 \times 10^{11}$ | $4 \times 10^{11}$ | $4 \times 10^{11}$ |
| | 700 hours | $1 \times 10^{11}$ | $2 \times 10^{11}$ | $1 \times 10^{11}$ |
| | 1000 hours | $9 \times 10^{10}$ | $1 \times 10^{11}$ | $9 \times 10^{10}$ |
| Heat diffusibility | (° C.) | 36 | 35 | 32 |
| Contact to surface metal foil | | Good | Excellent | — |

GTT = Glass transition temperature

Example 8

A varnish A was prepared in the same manner as in Example 1. The varnish A was applied to a 100 $\mu$m thick glass woven fabric and dried so as to attain a gelation time of 50 seconds (at 170° C.) and a resin flow of 10 mm at 170° C. at 20 kgf/cm$^2$ for 5 minutes, whereby a semi-cured prepreg M having an insulation layer thickness of 147 $\mu$m and a semi-cured prepreg N having an insulation layer thickness of 137 $\mu$m were obtained.

Separately, a 420 $\mu$m thick alloy sheet containing 99.9% by weight of Cu, 0.07% by weight of Fe and 0.03% by weight of P was provided for an internal layer. An etching resist was retained in a semiconductor-chip-mounting portion for a package having a 50 mm×50 mm square size on the front surface and a corresponding portion on the reverse surface, and both the surfaces of the alloy sheet were etched to a depth of 140 $\mu$m each to form central convex portions. The resist was removed, and then a liquid etching resist was applied to the resultant entire surfaces to form coatings having a thickness of 25 $\mu$m, and the etching resist in a clearance hole portion was removed while retaining a circular etching resist having a diameter of 300 $\mu$m in the central portion which was to form protrusions having the form of a frustum of a cone in the semiconductor-chip-mounting portion, the front and reverse surfaces of the alloy sheet were etched to form an elevated flat portion having a height of 140 $\mu$m on the front side and 100 protrusions having the form of a frustum of a cone and having a height of 140 $\mu$m. a bottom diameter of 655 $\mu$m and a top diameter of 212 $\mu$m in a central 13 mm×13 mm square area on each surface and make a clearance hole having a diameter of 0.6 mm at the same time.

The entire surface of the metal sheet was treated to form black copper oxide. The prepreg M having a metal-protrusions-corresponding portion punched out was placed on the front surface, the prepreg N having a metal-protrusions-corresponding portion punched out was placed on the reverse surface, 12 $\mu$m thick electroplated copper foils were placed thereon, and the resultant set was laminate-formed at 200° C. at 20 kg/cm$^2$ under a vacuum of 30 mmHg or lower for 2 hours to integrate the above components. Then, a resin which had flowed out on the front-surface protrusions having the form of a frustum of a cone was removed by a sand blasting method to expose the metal surface of the protrusions, and a through hole having a diameter of 0.25 $\mu$m was made in the clearance hole portion with a mechanical drill, desmeared and plated with copper by electroless plating and electroplating to form a 20 $\mu$m thick copper plating layer. An etching resist was applied to the front and reverse surfaces, the resist on the semiconductor-chip-mounting portion where the protrusions were in contact with the metal foil was retained on the front surface, a solder ball pad having a diameter of 0.6 mm was formed on the reverse surface but not on the portion of the protrusions, and the solder ball pad was connected to the copper foil on the protrusions to form a circuit on the entire metal sheet. The resist was removed by dissolving the same, a plating resist was applied to portions other than any one of a semiconductor-chip-mounting portion, a bonding pad portion and a ball pad portion, and nickel plating and gold plating were carried out to complete a printed wiring board.

A semiconductor chip having a square size of 13 mm×13 mm was bonded and fixed to the copper surface of the protrusions having the form of a frustum of a cone, which protrusions were the semiconductor-mounting portion, with a silver paste, wire bonding was carried out, and the semiconductor chip, wires and bonding pads were encapsulated with a sealing silica-containing epoxy liquid resin. Solder balls were bonded to the reverse surface to obtain a semiconductor plastic package. The semiconductor plastic package was bonded to an epoxy resin mother board printed wiring board by melting the solder balls. The semiconductor plastic package was evaluated, and Table 4 shows the results.

Example 9

Figure 7:
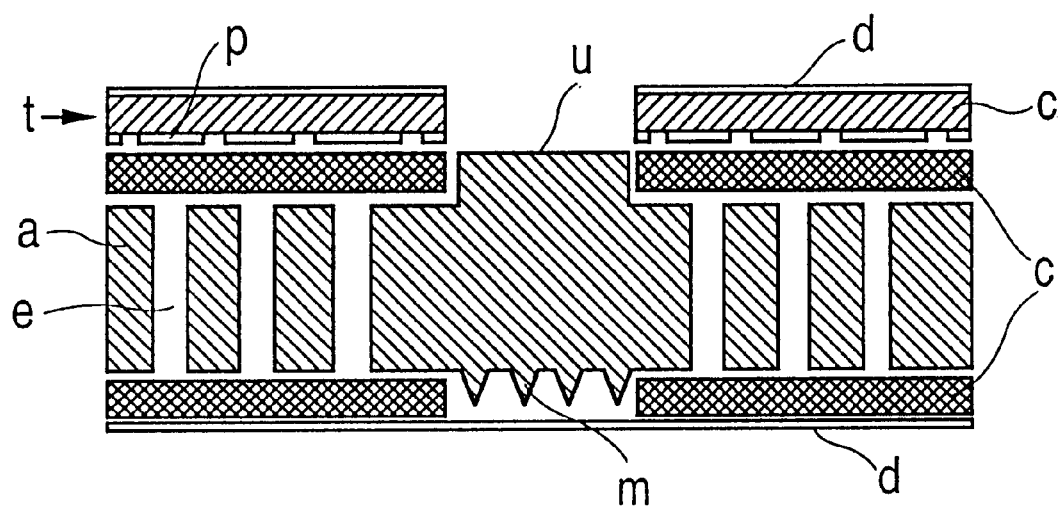
FIG. 7 schematically shows part of the step of producing a semiconductor plastic package in which a convex portion is formed on a semiconductor-chip-mounting surface side and protrusions having the form of a frustum of a cone are formed on the other side.

In Example 8, 12 $\mu$m thick electrolytic copper foils were placed on both the surfaces of one prepreg M sheet, and the resultant set was laminate-formed at 200° C. at 20 kg/cm$^2$ under a vacuum of 30 mmHg or lower, to obtain a double-side copper-clad laminate. A circuit was formed on one surface of the laminate and treated to form black copper oxide, a hole slightly larger than the size of the elevated flat portion (FIG. 7, u) was formed, to obtain a double-side copper-clad laminate which a circuit formed on one surface (FIG. 7).

One prepreg M sheet having a hole slightly larger than the size of the elevated flat portion was placed on the elevated flat portion surface side of the same metal sheet as that prepared in Example 8, the above double-side copper-clad laminate was placed thereon with its circuit facing downward, one prepreg N sheet having a hole slightly larger than the size of the protrusions having the form of a frustum of a cone was placed on the other surface side of the metal sheet, 12 μm thick electrolytic copper foils were placed thereon, and the resultant set was laminate-formed. A laminate portion on the elevated flat portion and a resin which had flowed out were removed, and circuits were formed on the front and reverse surfaces. The front-surface elevated flat portion as a semiconductor-chip-mounting portion, a bonding pad portion and a ball pad portion on the reverse surface were coated with a plating resist, and nickel plating and gold plating were carried out to obtain a multi-layered printed wiring board. The multi-layered printed wiring board was bonded to a mother board printed wiring board, and was evaluated, in the same manner as in Example 8, and Table 4 shows the results.

Comparative Example 3

A printed wiring board was prepared in the same manner as in Example 9 except that a semiconductor chip was mounted without removing a resin on the surface of the protrusions having the form of a frustum of a cone and that ball pads were formed on the protrusions having the form of a frustum of a cone on the reverse surface. The printed wiring board was bonded to a mother board printed wiring board with solder balls. Table 4 shows the results of evaluation thereof.

Comparative Example 4

Two prepreg sheets which were the same as the prepreg M in Example 8 were prepared. Electroplated copper foils having a thickness of 12 μm were placed on both the surfaces of the combined two prepreg sheets, and the resultant set was laminate-formed at 200° C. at 20 kgf/cm² under a vacuum of 30 mmHg or less for 2 hours, to obtain a double-side copper-clad laminate. A through hole having a diameter of 0.25 mm was drilled in a predetermined position, desmeared and plated with copper. Circuits were formed on the front and reverse surfaces of the above laminate according to a known method, a plating resist was covered thereon, and nickel placing and gold plating were carried out. In this board, a through hole for heat diffusion was formed in a portion where a semiconductor chip was to be mounted, and a semiconductor chip was bonded thereon with a silver paste. Wire bonding was carried out, then, encapsulation with a sealing epoxy compound was carried out in the same manner as in Example 8, and solder balls were bonded. The resultant semiconductor plastic package was bonded to a mother board. Table 4 shows the results of evaluation thereof.

TABLE 4

| | | Example 8 | Example 9 | CEx. 3 | CEx. 4 |
|---|---|---|---|---|---|
| Bali share strength | | 1.6 | 1.5 | 1.2 | — |
| Heat resistance ① after moisture absorption | Ordinary state | No failure | No failure | — | No failure |
| | 24 hours | No failure | No failure | — | No failure |
| | 48 hours | No failure | No failure | — | No failure |
| | 72 hours | No failure | No failure | — | No failure |
| | 96 hours | No failure | No failure | — | No failure |
| | 120 hours | No failure | No failure | — | partly peeled |
| | 144 hours | No failure | No failure | — | partly peeled |
| | 168 hours | No failure | No failure | — | Partly peeled |
| Heat resistance ② after moisture absorption | Ordinary state | No failure | No failure | — | No failure |
| | 24 hours | No failure | No failure | — | partly peeled |
| | 48 hours | No failure | No failure | — | largely peeled |
| | 72 hours | No failure | No failure | — | Wire broken |
| | 96 hours | No failure | No failure | — | Wire broken |
| | 120 hours | No failure | No failure | — | Wire broken |
| | 144 hours | No failure | No failure | — | — |
| | 168 hours | No failure | No failure | — | — |
| GTT | (° C.) | 234 | 234 | 234 | 234 |
| Insulation resistance (Ω) after pressure cooker treatment | Ordinary state | $5 \times 10^{14}$ | $4 \times 10^{14}$ | — | $6 \times 10^{14}$ |
| | 200 hours | $5 \times 10^{12}$ | $6 \times 10^{12}$ | — | $5 \times 10^{12}$ |
| | 500 hours | $5 \times 10^{11}$ | $5 \times 10^{11}$ | — | $3 \times 10^{11}$ |
| | 700 hours | $6 \times 10^{10}$ | $5 \times 10^{10}$ | — | $4 \times 10^{10}$ |
| | 1000 hours | $4 \times 10^{10}$ | $3 \times 10^{10}$ | — | $2 \times 10^{10}$ |
| Migration resistance (Ω) | Ordinary state | $5 \times 10^{13}$ | $6 \times 10^{13}$ | — | $5 \times 10^{13}$ |
| | 200 hours | $6 \times 10^{11}$ | $5 \times 10^{11}$ | — | $4 \times 10^{11}$ |
| | 500 hours | $6 \times 10^{11}$ | $6 \times 10^{11}$ | — | $4 \times 10^{11}$ |
| | 700 hours | $2 \times 10^{11}$ | $1 \times 10^{11}$ | — | $1 \times 10^{11}$ |
| | 1000 hours | $9 \times 10^{10}$ | $9 \times 10^{10}$ | — | $8 \times 10^{10}$ |
| Heat diffusibility | (° C.) | 33 | 34 | 45 | 56 |

CEx. = Comparative Example
GTT = Glass transition temperature

Example 10

A varnish A was prepared in the same manner as in Example 1. The varnish A was applied to a 100 μm thick glass woven fabric and dried at 150° C. so as to attain a gelation time of 50 seconds (at 170° C.), whereby a semi-cured prepreg a having a thickness of 110 μm was obtained.

Separately, a 250 μm thick copper sheet having a purity of 99.9% was provided for an internal layer. Further, a 20 μm thick stainless steel sheet having holes having a diameter of 0.3 mm at intervals of 2 mm in a portion corresponding to a 13 mm×13 mm semiconductor-chip-mounting portion in a package having a square size of 50 mm×50 mm was placed on one surface (front surface) of the copper sheet. A lead-free solder containing copper/tin/silver=0.5/96/3.5 wt % (melting point: 221° C.) was melted at 260° C. and printed on the copper sheet through the stainless steel. On the other surface, a liquid etching resist was applied to the entire surface of the copper sheet and dried to form a coating having a thickness of 20 μm, the resist was exposed to ultraviolet light so as to remove the etching resist in a clearance hole portion, followed by development with a 1% sodium carbonate aqueous solution. The front surface was etched at 1.5 kgf/cm² and the reverse surface was etched at 2.5 kgf/cm² concurrently, to form 16 protrusions having the form of a frustum of a cone and having a height of 117 μm including the height of a solder and make a clearance hole having a diameter of 0.6 mm at the same time. The clearance hole had almost the same hole diameter in the front and reverse surfaces. The above prepreg O sheets were placed on both the surfaces of the sheet, 12 μm thick electrolytic copper foils were placed thereon, and the resultant set was laminate-formed at 230° C. at 20 kg/cm² under a vacuum of 30 mmHg or lower for 2 hours to integrate the above components. A through hole having a diameter of 0.25 μm was drilled in the center of the clearance hole portion so as not to bring it into contact with the metal of the clearance hole portion, through holes for heat diffusion were made in four corners so as to be in contact with the metal sheet as an internal layer, and copper plating was carried out by electroless plating and electroplating, to form a 17 μm thick copper plating layer on the inner wall surface of each through hole. A liquid etching resist was applied to the front and reverse surfaces and dried, positive films were placed on both the surfaces, followed by exposure and development, to form front-surface and reverse-surface circuits. Then, a plating resist was applied to portions other than any one of a semiconductor-chip-mounting portion, a bonding pad portion and a ball pad portion, and nickel plating and gold plating were carried out to complete a printed wiring board.

A semiconductor chip having a square size of 13 mm×13 mm was bonded and fixed to the semiconductor-mounting portion on the front surface with a silver paste, wire bonding was carried out, and the semiconductor chip, wires and bonding pads were encapsulated with a sealing silica-containing epoxy liquid resin. Solder balls were bonded to the reverse surface to obtain a semiconductor plastic package. The semiconductor plastic package was bonded to an epoxy resin mother board printed wiring board by melting the solder balls. The semiconductor plastic package was evaluated, and Table 5 shows the results.

Comparative Example 5

In the procedures of Example 10, each of the front and reverse surfaces of a sheet as an internal layer was etched at a pressure of 2 kgf/cm², and when protrusions having the form of a frustum of a cone and having the same height were formed, the etching was terminated. A clearance hole was not uniformly formed. That is, the clearance hole had a diameter of 0.3 mm in the front surface and a diameter of 0.6 mm in the reverse surface. When a through hole having a diameter of 2.5 mm was made, therefore, the internal wall of the hole was in contact with the metal sheet in many places.

Example 11

A prepreg O was prepared in the same manner as in Example 10.

A 450 μm thick copper sheet having a purity of 99.9% was provided for an internal layer. An etching resist film having a thickness of 20 μm was formed on portions other than any one of a semiconductor-chip-mounting portion having a size of 13 mm×13 mm in a 50 mm×50mm package to be formed, on the front surface, a 13 mm×13 mm area corresponding thereto on the reverse surface and clearance hole portions, and both the surfaces were etched until the copper sheet was etched to a depth of the thickness of the sheet. The etching resist was removed, and then a 7 μm thick stainless steel sheet having holes having a diameter of 0.3 mm at intervals of 0.3 mm was placed on each surface of the copper sheet. A lead-free solder containing copper/tin/silver=0.5/96/3.5 wt % (melting point: 221° C.) was melted at 260° C. and printed on the front and reverse surfaces of the copper sheet through the stainless steel sheets. The stainless steel sheets were removed, both the surfaces were etched with an alkaline etching solution to form 16 protrusions having the form of a frustum of a cone and having a height of 115 μm including the height of a solder, a bottom diameter of 526 μm and a top diameter of 197 μm and make a clearance hole having a diameter of 0.6 mm at the same time. The above prepreg O sheets were placed on both the surfaces of the sheet, 12 μm thick electroplated copper foils were placed thereon, and the resultant set was laminate-formed at 230° C. at 20 kg/cm² under a vacuum of 30 mmHg or lower for 2 hours to integrate the above components. A through hole having a diameter of 0.25 μm was drilled in the center of the clearance hole portion so as not to bring it into contact with the metal of the clearance hole portion, and copper plating was carried out by electroless plating and electroplating, to form a 17 μm thick copper plating layer on the inner wall surface of the through hole. A liquid etching resist was applied to the front and reverse surfaces and dried, positive films were placed on both the surfaces, followed by exposure and development, to form front-surface and reverse-surface circuits. Then, a plating resist was applied to portions other than any one of a semiconductor-chip-mounting portion, a bonding pad portion and a ball pad portion, and nickel plating and gold plating were carried out to complete a printed wiring board.

A semiconductor chip having a square size of 13 mm×13 mm was bonded and fixed to the semiconductor-mounting portion on the front surface with a silver paste, wire bonding was carried out, and the semiconductor chip, wires and bonding pads were encapsulated with a sealing silica-containing epoxy liquid resin. Solder balls were bonded to the reverse surface to obtain a semiconductor plastic package. The semiconductor plastic package was bonded to an epoxy resin mother board printed wiring board by melting the solder balls. The semiconductor plastic package was evaluated, and Table 5 shows the results.

TABLE 5

|  |  | Example 10 | Example 11 |
| --- | --- | --- | --- |
| Contact between chip-mounting portion and protrusions (Contact of protrusions to chip-mounting portion and ball pad portion in Example 11) |  | Excellent | Excellent |
| Heat resistance ① | Ordinary state | No failure | No failure |
| after moisture absorption | 24 hours | No failure | No failure |
|  | 48 hours | No failure | No failure |
|  | 72 hours | No failure | No failure |

TABLE 5-continued

|  |  | Example 10 | Example 11 |
|---|---|---|---|
|  | 96 hours | No failure | No failure |
|  | 120 hours | No failure | No failure |
|  | 144 hours | No failure | No failure |
|  | 168 hours | No failure | No failure |
| Heat resistance ② after moisture absorption | Ordinary state | No failure | No failure |
|  | 24 hours | No failure | No failure |
|  | 48 hours | No failure | No failure |
|  | 72 hours | No failure | No failure |
|  | 96 hours | No failure | No failure |
|  | 120 hours | No failure | No failure |
|  | 144 hours | No failure | No failure |
|  | 168 hours | No failure | No failure |
| GTT | (° C.) | 237 | 237 |
| Heat diffusibility | (° C.) | 36 | 35 |

GTT = Glass transition temperature

Example 12

A varnish A was prepared in the same manner as in Example 1. The varnish A was applied to a 100 μm thick glass woven fabric and dried at 150° C. so as to attain a gelation time of 50 seconds (at 170° C.) and a resin flow of 10 mm at 170° C. at 20 kgf/cm² for 5 minutes, whereby a semi-cured prepreg P having a thickness of 137 μm was obtained.

Separately, a 400 μm thick alloy sheet containing 99.9% by weight of Cu, 0.07% by weight of Fe and 0.03% by weight of P was provided for an internal layer. An etching resist was retained in a semiconductor-chip-mounting portion for a package having a 50 mm×50 mm square size on the front surface and a corresponding portion on the reverse surface, and both the surfaces of the alloy sheet were etched to a depth of 130 μm each to form central convex portions. Then a liquid etching resist was applied to the resultant entire surfaces to form coatings having a thickness of 25 μm, and the etching resist in a clearance hole portion was removed while retaining a circular etching resist having a diameter of 200 μm in each of a central portion which was to a semiconductor-chip-mounting portion on the front surface and a portion which was to form protrusions having the form of a frustum of a cone on the reverse surface, the front and reverse surfaces of the alloy sheet were etched to form 144 protrusions having the form of a frustum of a cone and having a height of 130 μm, a bottom diameter of 658 μm and a top diameter of 162 μm in a central 13 mm×13 mm square area on each surface and make a clearance hole having a diameter of 0.6 mm at the same time.

The entire surface of the metal sheet was treated to form black copper oxide. The prepreg P sheets were placed on both the surfaces, 12 μm thick electrolytic copper foils were placed thereon, and the resultant set was laminate-formed at 200° C. at 20 kg/cm² under a vacuum of 30 mmHg or lower for 2 hours to integrate the above components. Then, a through hole having a diameter of 0.25 μm was made in the clearance hole portion with a mechanical drill, desmeared and plated with copper by electroless plating and electroplating to form a 20 μm thick copper plating layer. An etching resist was applied to the front and reverse surfaces, the resist on the semiconductor-chip-mounting portion where the protrusions were in contact with the metal foil was retained on the front surface, a solder ball pad having a diameter of 0.6 mm was formed on the reverse surface but not on the portion of the protrusions, and the solder ball pad was connected to the copper foil on the protrusions to form a circuit on the entire metal sheet. The resist was removed by dissolving the same, a plating resist was applied to portions other than any one of a semiconductor-chip-mounting portion, a bonding pad portion and a ball pad portion, and nickel plating and gold plating were carried out to complete a printed wiring board.

A semiconductor chip having a square size of 13 mm×13 mm was bonded and fixed to the electrically and thermally conductive copper surface of the protrusions having the form of a frustum of a cone, which protrusions were the semiconductor-mounting portion, with a silver paste, wire bonding was carried out, and the semiconductor chip, wires and bonding pads were encapsulated with a sealing silica-containing epoxy liquid resin. Solder balls were bonded to the reverse surface to obtain a semiconductor plastic package. The semiconductor plastic package was bonded to an epoxy resin mother board printed wiring board by melting the solder balls. The semiconductor plastic package was evaluated, and Table 6 shows the results.

TABLE 5

|  |  | Example 12 |
|---|---|---|
| Ball share strength (kgf) |  | 1.6 |
| Heat resistance ① after moisture absorption | Ordinary state | No failure |
|  | 24 hours | No failure |
|  | 48 hours | No failure |
|  | 72 hours | No failure |
|  | 96 hours | No failure |
|  | 120 hours | No failure |
|  | 144 hours | No failure |
|  | 168 hours | No failure |
| Heat resistance ② after moisture absorption | Ordinary state | No failure |
|  | 24 hours | No failure |
|  | 48 hours | No failure |
|  | 72 hours | No failure |
|  | 96 hours | No failure |
|  | 120 hours | No failure |
|  | 144 hours | No failure |
|  | 168 hours | No failure |
| GTT | (° C.) | 234 |
| Insulation resistance (Ω) after pressure cooker treatment | Ordinary state | $5 \times 10^{14}$ |
|  | 200 hours | $5 \times 10^{12}$ |
|  | 500 hours | $5 \times 10^{11}$ |
|  | 700 hours | $6 \times 10^{10}$ |
|  | 1000 hours | $4 \times 10^{10}$ |
| Anti-migration Properties (Ω) | Ordinary state | $5 \times 10^{13}$ |
|  | 200 hours | $6 \times 10^{11}$ |
|  | 500 hours | $2 \times 10^{11}$ |
|  | 700 hours | $9 \times 10^{10}$ |
|  | 1000 hours | $9 \times 10^{10}$ |
| GTT | (° C.) | 234 |
| Heat diffusibility | (° C.) | 33 |

GTT = Glass transition temperature

What is claimed is:

1. A method of producing a metal sheet for a metal-sheet-inserted double-side metal-foil-clad laminate for a semiconductor plastic package, the metal-sheet-inserted double-side metal-foil-clad laminate being a printed wiring board to which at least one semiconductor chip is to be fixed and being obtained by placing prepregs of a thermosetting resin composition in a semi-cured state, resin sheets of said thermosetting resin composition, metal foils with said thermosetting resin composition or a layer of said thermosetting resin composition on front and reverse surfaces of a metal sheet having a plurality of metal protrusions having the form of a frustum of a cone and a clearance hole or a slit hole in which a through hole for conduction between the front and reverse surfaces, placing metal foil or foils thereon and laminate-forming the resultant set under heat and pressure, the method comprising placing a solder for forming the protrusions having the form of a frustum of a cone on part of one surface of a metal sheet as a raw material, placing an etching resist for forming the clearance hole or the slit hole by etching on the other surface of the metal sheet, and simultaneously forming the protrusions having the form of a frustum of a cone and the clearance hole or the slit hole in an etching step of blowing an alkaline etching liquid having a lower pressure to a surface where the protrusions having the form of a frustum of a cone are to be formed and blowing an alkaline etching liquid having a higher pressure to the other surface, to form a printed wiring board having a specially shaped metal sheet inserted therein.

2. A method as recited in claim 1, wherein the metal sheet as a raw material is etched partially in the thickness direction thereof, then, solders are bonded to the surface where the protrusions having the form of a cone or a frustum of a cone are to be formed and that portion of the reverse surface which corresponds to the above surface, and an alkaline etching solution is blown to both the surfaces at an equal pressure to form solder-bonded protrusions having the form of a cone or a frustum of a cone and the clearance hole or the slit hole at the same time, to form the metal sheet for a printed wiring board having a specially shaped metal sheet inserted.

3. A method as recited in claim 1, wherein a metal sheet is formed of a copper alloy having a copper content of 95% by weight or pure copper is used as the metal sheet as a raw material.

4. A method as recited in claim 1, wherein a thermosetting resin composition contains a polyfunctional cyanate ester and a prepolymer of said cyanate ester as essential components is used as the thermosetting resin composition.

5. A method of producing a copper-clad sheet for a printed wiring board for a semiconductor plastic package having a structure in which a metal sheet having a size nearly equal to the size of a printed wiring board is disposed nearly in the middle of the thickness direction of the printed wiring board, at least one semiconductor chip is fixed on one surface of the printed wiring board with a thermally conductive adhesive, the metal sheet is insulated from circuits on the front and reverse surfaces of the printed wiring board with a thermosetting resin composition, a circuit conductor formed on the surface of the printed wiring board and the semiconductor chip are connected with each other by wire bonding, a signal propagation circuit conductor on the surface of the printed wiring board and a circuit conductor formed on the reverse surface of the printed wiring board or a circuit conductor pad formed for connection to an external portion of said package with solder balls are at least connected with a through hole conductor insulated from the metal sheet with a resin composition, at least one through hole forms a direct junction with the metal sheet disposed as an inner layer, and at least the semiconductor chip, the bonding wire and the bonding pad are encapsulated, the method comprising placing prepregs or resin sheets on positions of a plurality of metal protrusions which have the form of a cone or a frustum of a cone each and are formed on parts of both surfaces of the metal sheet, the prepregs or resin sheets having holes made slightly greater than the area of the position, placing metal foils thereon, and applying heat and pressure to fill the resin in a clearance hole made in the metal sheet and flow the resin into spaces among a plurality of the metal protrusions, an outermost metal foil being in contact with tops of the metal protrusions.

6. A method as recited in claim 5, wherein a metal sheet is formed of a copper alloy having a copper content of 95% by weight or pure copper is used as the metal sheet as a raw material.

7. A method as recited in claim 5, wherein a thermosetting resin composition contains a polyfunctional cyanate ester and a prepolymer of said cyanate ester as essential components is used as the thermosetting resin composition.

* * * * *